(12) United States Patent
Chen et al.

(10) Patent No.: US 6,373,743 B1
(45) Date of Patent: Apr. 16, 2002

(54) FERROELECTRIC MEMORY AND METHOD OF OPERATING SAME

(75) Inventors: Zheng Chen; Myoungho Lim; Vikram Joshi; Carlos A. Paz de Araujo; Larry D. McMillan, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/385,308

(22) Filed: Aug. 30, 1999

(51) Int. Cl.[7] ............................................. G11C 11/22
(52) U.S. Cl. ...................................... 365/145; 365/149
(58) Field of Search ................................ 365/145, 117, 365/149; 257/295

(56) References Cited

U.S. PATENT DOCUMENTS

| | | |
|---|---|---|
| 2,791,758 A | 5/1957 | Looney |
| 2,791,759 A | 5/1957 | Brown |
| 2,791,760 A | 5/1957 | Ross |
| 2,791,761 A | 5/1957 | Morton |
| 2,876,436 A | 3/1959 | Anderson |
| 4,873,664 A | 10/1989 | Eaton, Jr. |
| 4,888,733 A | 12/1989 | Mobley |
| 5,303,182 A | 4/1994 | Nakao et al. |
| 5,361,225 A | 11/1994 | Ozawa |
| 5,365,094 A | 11/1994 | Takasu |
| 5,382,539 A | 1/1995 | Nakamura |
| 5,449,935 A | 9/1995 | Nakamura |
| 5,523,964 A | 6/1996 | McMillan et al. |
| 5,541,870 A | 7/1996 | Mihara et al. |
| 5,541,871 A | 7/1996 | Nishimura et al. |
| 5,541,873 A | 7/1996 | Nishimura et al. |
| 5,559,733 A | 9/1996 | McMillan et al. |
| 5,563,081 A | 10/1996 | Ozawa |
| 5,633,821 A * | 5/1997 | Nishimura et al. ......... 365/145 |
| 5,744,374 A | 4/1998 | Moon |
| 5,768,185 A | 6/1998 | Nakamura et al. |
| 5,886,920 A * | 3/1999 | Marshall et al. ............ 365/145 |
| 5,959,879 A * | 9/1999 | Koo ............................. 365/145 |
| 5,962,884 A * | 10/1999 | Hsu et al. .................... 257/295 |
| 6,011,285 A * | 1/2000 | Hsu et al. .................... 257/295 |

OTHER PUBLICATIONS

Auciello et al., "The Physics of Ferroelectric Memories," Physics Today, American Institue of Physics (Woodbury, NY), vol. 51 (No. 7), pp. 22–27 (Jul. 1998).

Hirai et al., "Formation of Metal/Ferroelectric/Insulator/Semiconductor Structure with a CeO2 Buffer Layer," Jpn. J. Appl. Phys., vol. 33 (No. 9B), pp. 5219–5221 (Sep. 1994).

Hirai et al., "Characterization of Metal/Ferroelectric/Insulator/Semiconductor Structure with CeO2 Buffer Layer," Jpn. J. Appl. Phys., vol. 34 (No. 8A), pp. 4163–4166 (Aug. 1995).

(List continued on next page.)

Primary Examiner—David Nelms
Assistant Examiner—Gene N. Auduong
(74) Attorney, Agent, or Firm—Patton Boggs LLP

(57) ABSTRACT

A ferroelectric non-volatile memory comprising: a plurality of memory cells each containing a ferroelectric FET, each of said ferroelectric FETs having a source, a drain, a substrate, and a gate. The FETs are arranged in an array comprising a plurality of rows and a plurality of columns. There are a plurality of row select lines, each associated with one of the rows of said ferroelectric FETs, and a plurality of column select lines, each associated with one of the columns of ferroelectric FETs. Each of the sources is directly electrically connected to its associated row select line, and each of the drains is directly electrically connected to its associated column select line. The source and substrate of each FET are also directly electrically connected. A memory cell is read by connecting its row select line to ground, and its column select line to a small voltage. All the gates, and the row select lines of non-selected cells are open or connected to a high resistance source. Thus, the current in the selected column select line and row select line is a measure of the state of the selected cell. Each FET is fabricated using a self-aligned process so that no portion of a source/drain underlies the gate.

4 Claims, 8 Drawing Sheets

OTHER PUBLICATIONS

Kim et al., "Memory window of Pt/SrBi2Ta2O9/CeO2/SiO2/Si structure for metal ferroelectric insulator semiconductor field effect transistor," Appl. Phys. Lett., American Institute of Physics, vol. 71 (No. 24), pp. 3507–3509 (Dec. 15, 1997).

Nakamura et al., "Preparation of Pb(Zr, Ti)O3 thin films on electrodes including IrO2," Appl. Phys. Lett., American Institute of Physics, vol. 65 (No. 12), pp. 1522–1524 (Sep. 19, 1994).

Scott et al., "Integrated Ferroelectrics," Condensed Matter News, vol. 1 (No. 3), pp. 16–20 (Jun. 1992).

Shin et al., "A Proposal of Pt/SrBi2Ta2O9/CeO2/Si Structure for Non Destructive Read Out Memory Devices," Extended Abstracts of the 1997 International Conference on Solid State Devices and Materials, pp. 32–33 (Jun. 1997).

Shu–Yau Wu, "A New Ferroelectric Memory Device, Metal–Ferroelectric–Semiconductor Transistor," IEEE Transactions on Electron Devices, vol. ED–21 (No. 8), pp. 499–504 (Aug. 1974).

S.Y. Wu, "Memory Retention and Switching Behavior of Metal–Ferroelectric–Semiconductor Transistors," Ferroelectrics, Gordon and Breach Science Publishers, Ltd. (Great Britain), pp. 379–383 (Jun. 1976).

* cited by examiner

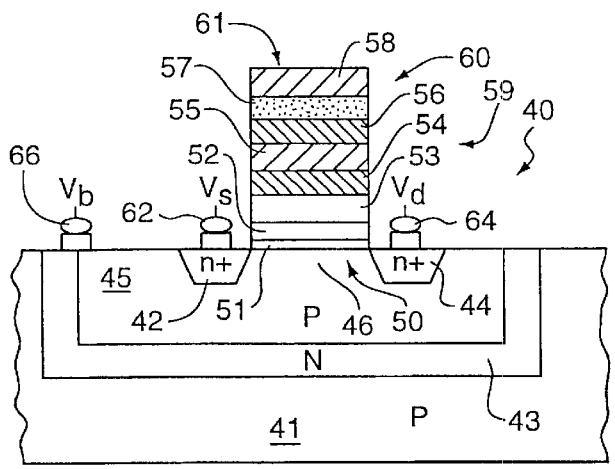
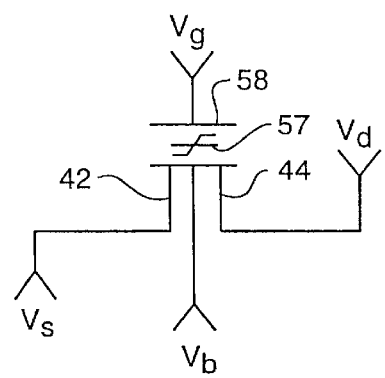
FIG. 1  FIG. 2
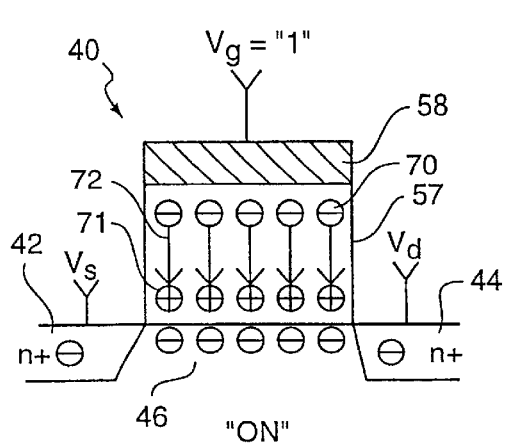
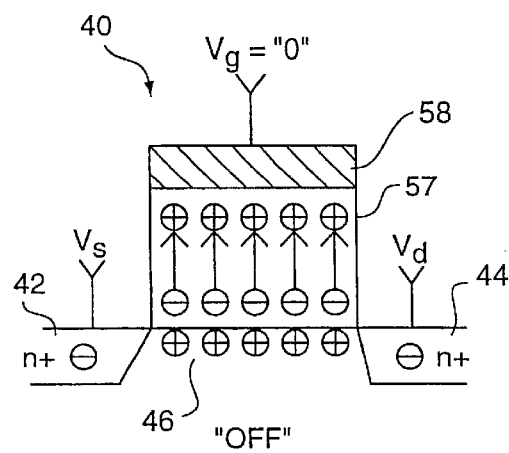
FIG. 3  FIG. 4
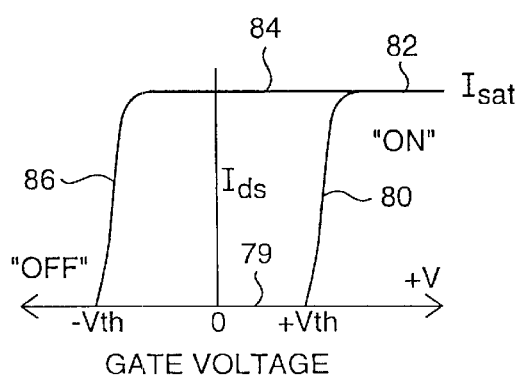
FIG. 5

FERROELECTRIC MEMORY AND METHOD OF OPERATING SAME

BACKGROUND OF THE INVENTION

1. Field of the Invention

This invention relates to ferroelectric memories, and more particularly to such a memory utilizing such ferroelectric field effect transistors and methods of operating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. However, it has been postulated for at least 40 years that it may be possible to design a memory in which the memory element is a ferroelectric field effect transistor (FET), which memory could be non-destructively read. See Shu-Yau Wu, "A New Ferroelectric Memory Device, Metal-Ferroelectric-Semiconductor Transistor", IEEE Transactions On Electron Devices, pp. 499–504, August 1974; S. Y. Wu, "Memory Retention and Switching Behavior Of Metal-Ferroelectric-Semiconductor Transistors", *Ferroelectrics*, Vol. 11, pp. 379–383, 1976; and J. R. Scott, C. A. Paz De Araujo, and L. D. McMillan, "Integrated Ferroelectrics", *Condensed Matter News*, Vol. 1, No. 3, pp. 15–20, 1992. Because the ferroelectric memory effect measured in the early devices of Wu was only a temporary, single state effect rather than a long lived two-state effect, it is now believed that this effect was charge injection effect rather than an effect due to ferroelectric switching. However, a metal-ferroelectric-insulator-semiconductor FET device, i.e. a MFISFET, has recently been reported that appears to show true ferroelectric memory behavior. See Tadahiko Hirai, et al., "Formation of Metal/Ferroelectric/Insulator/Semiconductor Structure With A $CeO_2$ Buffer Layer", *Japan Journal of Applied Physics*, Vol. 33, Part I, No. 9B, pp. 5219–5222, September 1994; Tadahiko Hirai et al., "Characterization of Metal/Ferroelectric/Insulator/Semiconductor Structure With A $CeO_2$ Buffer Layer", *Japan Journal of Applied Physics*, Vol.34, Part I, No. 8A, pp. 4163–4166, August 1995; Yong Tae Kim et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol.71 No. 24, pp. 3507–3509, Dec. 15, 1997; and U.S. Pat. No. 5,744,374 issued Apr. 28, 1998 to Jong Moon.

To make a memory requires not only a memory element, but also a means for addressing a large number of memory elements. Initially, it was believed that a ferroelectric memory element might be addressed by a simple array of rows and columns of conductors. A ferroelectric memory element, it was thought, could be located at each of the junctures of the array and addressed by applying a voltage to the conductors for the corresponding row and column. It was believed that if the voltage on each conductor was less than the threshold voltage for ferroelectric switching (coercive voltage) and the voltage difference between the conductors was greater than the coercive voltage, then only the selected cell would be written to or read, and the other cells would remain unchanged. However, it was found that this did not work because the neighboring unselected cells were disturbed by the voltages on the address lines. Thus, a switch was added between one of the address lines and each ferroelectric memory element. See U.S. Pat. No. 2,876,436 issued Mar. 3, 1959 to J. R. Anderson and U.S. Pat. No. 4,873,664 issued Oct. 10, 1989 to S. Sheffield Eaton, Jr. If the switch is a transistor as in the latter patent, the memory assumes a memory address architecture essentially the same as that of a conventional DRAM. However, when applied to a ferroelectric memory, even this architecture disturbed the memory cells attached to the same plate line as the addressed cell. That is, it has been found that ferroelectric materials do not have a sharp coercive threshold voltage, but rather even a small voltage will cause the ferroelectric to partially switch and, therefore, the repetitive application of small disturb voltages, such as occur in a conventional memory array, eventually causes the change or loss of a memory state. Therefore, a more complex architecture was proposed to overcome this disturb. See, for example, U.S. Pat. No. 4,888,733 issued Dec. 19, 1989 to Kenneth J. Mobley.

The above address schemes are all for a NVFRAM; that is, a memory utilizing a ferroelectric capacitor as a memory element, rather than for a memory utilizing a ferroelectric FET. A number of address architectures have been disclosed up to now for a memory in which the memory element is a ferroelectric FET. U.S. Pat. No. 5,523,964 issued Jun. 4, 1996 to McMillan et al., discloses a relatively complex addressing architecture, utilizing five transistors in each memory cell in addition to the ferroelectric FET. This complexity is incorporate to, like the Mobley et al. architecture, to avoid the disturb problem. Such complex architecture results in a memory that is much less dense and slower than, for example, a conventional DRAM. An architecture that uses one ferroelectric FET per memory cell has been proposed, but has not been implemented because it cannot be read properly if three neighboring cells all are in the conducting logic state. See, U.S. Pat. No. 5,449,935 issued to Takashi Nakamura on Sep. 12, 1995, col. 3, line 56–col. 4, line 15. Another such one-FET-per-memory cell design has been proposed in U.S. Pat. No. 5,768,185 issued to Takashi Nakamura and Yuichi Nakao on Jun. 16, 1998. However, during reading a voltage of 3 volts to 5 volts is applied to the word line while the ground or zero volts is applied to the bit line. While this is not enough to switch the ferroelectric in a single read cycle, as indicated above, it is now known that successive pulses of this magnitude, such as occur in a memory in the normal process of reading, can disturb the ferroelectric state. In addition, since the bit line is connected to the source and substrate and the word line is connected to the gate, it the WLn and BLm+1 signals are not exactly synchronized, the erase process of one cell will disturb the next. Under manufacturing specifications that are practically feasible, such exact synchronization is difficult to achieve in all cells. Therefore, in a commercial product there will short disturb voltages during the erase cycle also. Further, with this architecture, it is not possible to write a byte at a time, which is a much faster way of reading in a ferroelectric FET. Thus, it appears that the fact that the ferroelectric material does not have a sharp coercive field threshold and can be switched by repetitive applications of a small voltage has made several of the original objectives of research into ferroelectric memories unattainable. It would, therefore, be highly desirable to provide an architecture and method for addressing a ferroelectric memory, particularly a ferroelectric FET structure and method of making the structure, that was relatively simple and, at the same time, avoided the problems in the prior art, such as the disturb problem.

SUMMARY OF THE INVENTION

The invention solves the above problem by providing a method and apparatus for addressing a ferroelectric memory in which each memory cell preferably contains only the ferroelectric memory element, e.g., a ferroelectric FET.

In one aspect the invention comprises placing the source/drains of the non-selected memory cells n a high resistance or open state.

Another aspect of the invention comprises placing the gates of both the selected and non-selected cells in a high resistance or open state during the read cycle.

Another aspect of the invention comprises placing the source of the non-selected cells in a high resistance or open state during the read cycle.

Another aspect of the invention comprises placing the source of each memory cell in the selected row in a different electronic state than the sources of the cells in the non-selected cells during the read cycle.

A further aspect of the invention is to write an entire byte of cells at the same time, thus greatly increasing the speed of the write process.

The architecture of the memory is simple: one electrical element of each FET is connected to a row select line, and another electrical element of each FET is connected to a column select line. Preferably, there are two column select lines, one for the write function and one for the read function. Preferably, both column select lines are parallel, so the fact that there are two column lines adds little to the memory density.

The memory is preferably written to by setting either all the cells or a row of cells to a first logic state, and then placing the row select line of the selected memory cell or cells in a first electronic state, while the non-selected row select lines are placed in a second electronic state different than the state of the selected row line. Then any cell in any column of the selected row can be written to a second logic state different than the first logic state by placing the column line in the opposite logic state, or can be left in the first logic state by placing the column line in the same logic state as the row select line. Preferably, the first and second electronic states are voltage states. Preferably, all the column lines are selected at the same time, so that a byte of memory is written to simultaneously.

The memory is read by placing the column select line of the selected memory cell in a first electronic state and the row select line of the selected memory cell in a second electronic state different from said first electronic state, while the row select lines of the non-selected cells are placed in a third electronic state, which is preferably a high resistance state. The current in the column line then indicates the state of the selected cell. Preferably, all the columns are selected, so that a byte of memory is read simultaneously.

The probability of a disturb is significantly decreased by a FET structure in which no portion of the source/drains underlie the gate. A self-aligned process of making the FET automatically creates this structure, thus greatly lowering the probability of disturbing non-selected FETs during the write process, and disturbing any FETs during the read process.

The invention provides ferroelectric memory comprising a plurality of memory cells each containing a ferroelectric FET, each of the ferroelectric FETs having a source/drain and a gate, wherein no portion of the source/drain underlies the gate.

The invention also provides a method of reading a selected memory cell in a ferroelectric memory, the memory including a plurality of memory cells arranged in rows and at least one column, each the cell containing a ferroelectric electronic component having a first electrical element and a second electrical element; the memory including a first conducting line associated with the column, each the first electrical element in the plurality of memory cells connected to the conducting line, the method comprising: placing the second electrical element in the memory cells in the row in which the selected cell is located in a first electronic state, and placing the second element of the cells in the non-selected rows in a second electronic state different from the first electronic state; connecting a current source to the first conducting line; determining the current flow from the current source into the first conducting line; and providing a data output signal representative of the logic state of the selected memory cell and depending on the current flow in the column select line. Preferably, the current flow is represents a first logic state if it is an essentially zero current flow and represents a second logic state if it is a non-zero current flow. Preferably, the ferroelectric electronic component is a ferroelectric FET having a source and a drain, the first electrical element is the drain of the FET, and the second electrical element is the source of the FET, although, alternatively, the first electrical element is the source of the FET, and the second electrical element is the drain of the FET. Preferably, the second electronic state is a resistance state and the first electronic state is a voltage state. Preferably, the first electronic state is the ground voltage state, and the second electronic state is a resistance state of at least one gigaohm.

The invention further provides a method of reading a selected memory cell in a ferroelectric memory, the memory including a plurality of memory cells arranged in rows and at least one column, each the cell containing a ferroelectric FET having a first electrical element and a second electrical element; the memory including a column select line associated with the column and a plurality of row select lines, each the row select line associated with one of the rows, each the first electrical element in the plurality of memory cells connected to the column select line, and each the second electrical element in the plurality of memory cells connected to its associated row select line, the method comprising: placing the column select line in a first electronic state; placing the row select line associated with the selected memory cell in a second electronic state different than the first electronic state; placing the row select lines not associated with the selected memory cell in a third electronic state different from the first and second electronic state; and providing a data output signal representative of the logic state of the selected memory cell and depending on the current flow in the column select line. Preferably, there are a plurality of the column select lines, the step of placing the column select line comprises placing each of the column select lines in the first electronic state, and the step of providing comprises simultaneously providing a data output signals representative of the logic states in a plurality of the selected memory cells. Preferably, the current flow represents a first logic state if it is an essentially zero current flow and represents a second logic state if it is a non-zero current flow. Preferably, the current flow represents a first logic state if it is a first current flow and represents a second logic state if it is a second current flow higher than the first current flow.

Preferably, the third electronic state is a high resistance or floating state. Preferably, the ferroelectric FET has a source and a drain, the first electrical element is the drain, and the second electrical element is the source, although, alternatively, the first electrical element is the source, and the second electrical element is the drain. Preferably, the first and second electronic states are voltage states. Preferably, the second electronic state is the ground voltage state, and the third electronic state is a resistance state of at least one gigaohm. Preferably, the memory further includes a second conducting line associated with the column, the ferroelectric FET includes a third electrical element, and each the third electrical element in the plurality of memory cells is connected to the second conducting line, and wherein the method further includes the step of placing the second conducting line in an high resistance or open state. Preferably, the ferroelectric electronic component is a ferroelectric FET having a gate and the third electrical element is the gate of the FET.

In another aspect, the invention provides a method of reading a selected memory cell in a ferroelectric memory, the memory including a plurality of memory cells arranged in rows and columns, each the cell containing a ferroelectric FET having a gate electrode, a first source/drain, and a second source/drain, the method comprising: placing all of the gate electrodes in a gate electronic state; and reading the selected memory cell by determining a first source/drain electronic state of the first source/drain of the selected memory cell. Preferably, the first source/drain electronic state is a current flow state and the step of reading comprises: outputting a first signal representative of a first logic state of the selected memory cell if the current flow is a first current flow, and outputting a second signal representative of a second logic state of the selected memory cell if the current flow is a second current flow. Preferably, the second source/drain is a source, and the step of reading comprises applying a first voltage to each the source in the memory cells in the same row as the selected memory cell and applying a second voltage to each the source not in the selected row. Preferably, the gate electronic state is a high resistance electronic state, most preferably at least one gigaohm resistance.

The invention also provides a method of operating a ferroelectric memory including a plurality of memory cells, each the memory cell comprising a ferroelectric FET having a first source/drain, a second source/drain and a substrate, the method comprising the steps of: selecting one or more of the memory cells; placing the first source/drain of the cells which are not selected in a high resistance or open state; and performing a step selected from the steps consisting of writing information to the selected cell and reading information in the selected cell. Preferably, the method further comprises the step of placing the second source/drain of the cells which are not selected in a high resistance or open state. Preferably, the method further comprises the step of placing the substrate of the cells which are not selected in a high resistance or open state. Preferably, the step of performing comprises writing information to the selected cell. Preferably, the step of performing comprises reading information in the selected cell. Preferably, the resistance state is at least one gigaohm resistance. Preferably, the step of selecting comprises selecting a row of the memory cells, or alternatively, selecting a byte of the memory cells.

In a further aspect, the invention provides a method of writing to a ferroelectric memory, the memory including a plurality of memory cells each containing a ferroelectric FET, the ferroelectric FETs arranged in an array comprising a row and a plurality of columns, the method comprising: setting all of the cells in the row to a first logic state; and writing a second logic state to a selected cell in the row. Preferably, the memory includes a row line associated with the row and a plurality of column select lines, each column select line associated with one of the columns, and the step of writing a second logic state comprises placing the row line in a first electronic state and placing the column line associated with the selected cell in a second electronic state different than the first electronic state. Preferably, the first and second electronic states are voltage states. Preferably, the array comprises a plurality of rows of memory cells, the step of setting comprises setting all of the cells in a selected row to the first logic state, and the step of writing comprises writing the second logic state to a selected cell in the selected row. Preferably, the memory includes a row select line associated with each of the rows, and a plurality of column select lines, each column select line associated with one of the columns, and the step of writing a second logic state comprises placing the row select line in the selected row in a first electronic state and placing the column line associated with the selected cell in a second electronic state different than the first electronic state. Preferably, the array comprises a plurality of rows of memory cells, the step of setting comprises setting all of the cells in all of the rows to the first logic state, and the step of writing comprises writing the second logic state to a selected cell in a selected row. Preferably, the memory includes a row select line associated with each of the rows, and a plurality of column select lines, each column select line associated with one of the columns, and the step of writing a second logic state comprises placing the row select line of the selected row in a first electronic state and placing the column lines associated with the selected cells in a second electronic state different than the first electronic state. Preferably, the first and second electronic states are voltage states. Preferably, the first electronic state is the ground or logic "0" voltage, and the second electronic state is the high or logic "1" voltage. Preferably, the column lines not associated with the selected cell are placed in the ground or logic "0" state during the step of writing a second logic state. Preferably, the step of writing the second logic state comprises writing to a plurality of the selected cells. Preferably, wherein the plurality of selected cells are written to simultaneously.

In yet another aspect, the invention provides a method of writing to a ferroelectric memory, the memory including a plurality of memory cells each containing a ferroelectric FET, the ferroelectric FETs arranged in an array comprising a plurality of rows and a plurality of columns, the memory further including a plurality of row select lines, each of the row select lines associated with one of the rows of the ferroelectric FETs, the method comprising: selecting one of the plurality of rows; and simultaneously writing data to a plurality of memory cells in the selected row.

In still a further aspect, the invention provides a method of fabricating a ferroelectric memory having a gate structure comprising one or more material layers, at least one of the layers including a ferroelectric material, the method comprising: providing a semiconducting substrate; fabricating a first layer of the gate structure on the substrate; and forming an active area adjacent to first layer utilizing a self-aligned process. Preferably, the step of forming comprises forming a source. Preferably, the step of forming comprises forming a drain. Preferably, the step of forming comprises the steps of: placing a dopant material on or in the substrate; and heating the substrate to drive the dopant material into the substrate. Preferably, the step of placing comprises a step selected from the group consisting of diffusion and ion implantation. Preferably, the step of placing comprises placing the dopant material on the substrate. Preferably, the first layer is a non-ferroelectric insulating layer, and further including the step of forming a second layer comprising the ferroelectric material over the first layer. Preferably, the method further includes the step of forming a conductive layer over the second layer. Preferably, the step of forming an active area is performed after the step of forming a conductive layer. Preferably, the conductive layer is platinum.

The invention not only provides a simpler and much more dense ferroelectric memory, but also provides one that can be manufactured easily. The invention also provides a true random access ferroelectric FET memory. Numerous other features, objects and advantages of the invention will become apparent from the following description when read in conjunction with the accompanying drawings.

BRIEF DESCRIPTION OF THE DRAWINGS

FIG. 1 shows a cross-sectional view of a preferred embodiment of a ferroelectric FET according to the invention;

FIG. 2 is an equivalent circuit diagram of the ferroelectric FET of FIG. 1;

FIG. 3 illustrates the state of polarization of the ferroelectric material and the resulting channel state for the FET of FIG. 1 for the "ON" state;

FIG. 4 illustrates the state of polarization of the ferroelectric material and the resulting channel state for the FET of FIG. 1 for the "OFF" state;

FIG. 5 illustrates a graph of drain to source current versus gate voltage for an idealized ferroelectric FET;

DETAILED DESCRIPTION OF THE PREFERRED EMBODIMENT

1. Introduction

Figure 6:
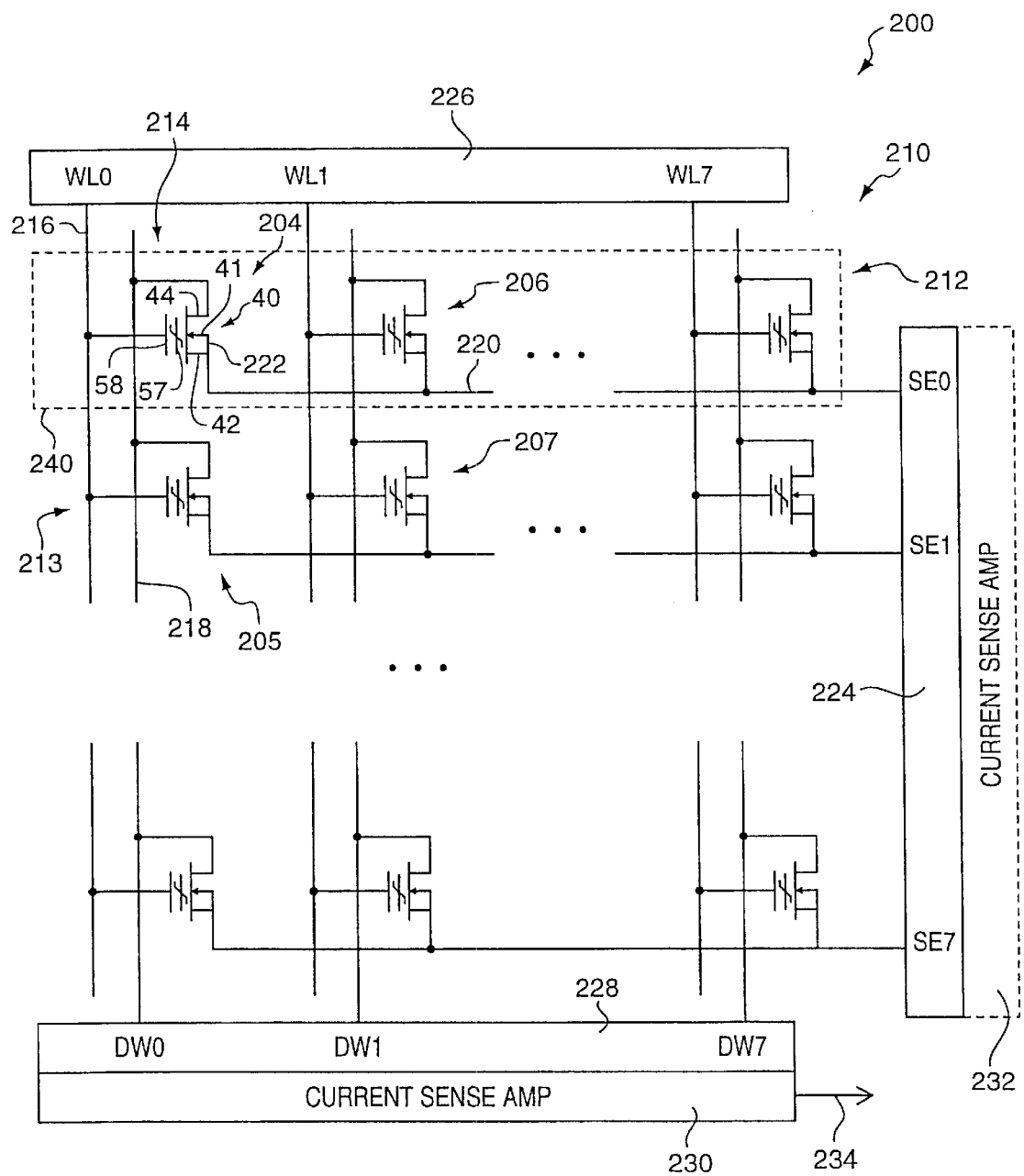
FIG. 6 shows a block electrical diagram of the preferred embodiment of a memory array according to the invention.

Directing attention to FIG. 1, a cross-sectional view of a ferroelectric FET 40 according to the invention is shown. The FET 40 includes a substrate 41 which is preferably p-type silicon, but may be any other appropriate semiconductor, such as gallium arsenide, silicon germanium, and others. A deep well 43, preferably an n-type well, is formed in substrate 41, and a less deep well 45, preferably a p-type well, is formed within well 43. Doped active areas 42 and 44, preferably n-type, are formed in well 45. We shall generally refer to these active areas 42 and 44 herein as source/drains since they can either be a source or a drain depending on the relative voltages applied to the areas. In certain portions of this disclosure, the voltages applied to these areas indicate that one is a source and the other is a drain; in these portions, we will then refer to them specifically as either a source or a drain. A channel region 46, preferably also n-type, but not as highly doped as source/drains 42 and 44, is formed between the source/drains 42 and 44. A gate structure 61 is formed on substrate 41 above channel region 46. In the preferred embodiment, gate structure 61 is a mutilayer structure, though usually it will not include all the layers 51 through 58 shown in FIG. 1. That is, the gate structure 61 shown in FIG. 1 is intended to illustrate the layers that could be included in the structure. The fundamental layers involved are a insulating layer 50, a floating gate layer 59, a ferroelectric layer 57, and a gate electrode layer 58. Insulating layer 50, often referred to as the "gate oxide", is shown as a multilayer structure comprising layers 51, 52, and 53, each of which is a different insulator. Preferably, layer 51 is an insulator closely related to the material of the substrate 41. Preferably, layer 52 is a buffer layer that can perform one or both of two functions: assisting in the adhesion of the layers above it to the layer below it; and preventing the migration of elements in the layers above it to the layers below it. Insulating layer 53 is considered to be the primary insulating layer of the gate, and is preferably a material having dielectric properties suitable for effective operation of the FET. It should be understood that a single material may perform the functions of layers 52 and 53, or even of all three layers 51, 52, and 53. A floating conducting gate 59 is formed on insulating layer 50. Again, the floating gate is shown as three layers, 54, 55, and 56. In one embodiment, layer 54 is a polysilicon layer, layer 55 is an adhesion layer, and layer 56 is a layer of a metal, such as platinum. In another embodiment, layer 54 is an adhesion layer that assists in adhesion of the floating gate 59 to the layer below it. In this embodiment, layer 55 is considered to be the primary floating gate layer, and layer 56 is a conducting barrier layer, the purpose of which is to prevent the migration of elements in the layers above it to the layers below it. A ferroelectric layer 57 is formed on floating gate 59. A gate electrode 58 is formed on ferroelectric layer 57. It should be understood that ferroelectric layer 57 and gate electrode 58 can also be multilayer structures, though generally they are not. Wiring layers form electrical contacts 62, 64 and 66 to source/drain 42, source/drain 44, and substrate 41, respectively. Contact 66 is preferably located over a shallow p-well 47 (FIG. 14) at the junction between deep well 43 and well 45. Gate 58 is preferably integral with its own wiring layer, so a contact is not shown.

Preferably, when semiconductor 41 is silicon, insulating layer 51 is silicon dioxide. Preferably, insulating layer 52 is a buffer layer, the purpose of which is to prevent elements in the layers above it from migrating into the semiconductor layer below it. It also may assist in adhering the layers above it to the layers below it. Buffer layer 52 preferably comprises $CeO_2$ or any other suitable material that either prevents elements from migrating and/or assists in adhering the layers above it to the silicon layers below it. Layer 53 is a gate insulator which preferably comprises one or more materials selected from: $Ta_2O_5$, $SiO_2$, $CeO_2$, $ZrO_2$, $Y_2O_3$, $YMnO_2$, and $SrTa_2O_6$. If insulator 53 is $Ta_2O_5$, its thickness is preferably 4 nanometers (nm) to 50 nm. If the insulator is $SiO_2$, its thickness is preferably 4 nm to 20 nm. If the insulator is $CeO_2$, its thickness is preferably 4 nanometers (nm) to 50 nm. If the insulator is $ZrO_2$, its thickness is preferably 4 nm to 50 nm. If the insulator is $Y_2O_3$, its thickness is preferably 4 nm to 50 nm. If the insulator is $YMnO_2$, its thickness is preferably 4 nm to 50 nm. If the insulator is $SrTa_2O_6$, its thickness is preferably 4 nm to 50 nm. In one preferred embodiment, gate insulator 50 comprises a layer 51 of silicon dioxide and a layer 53 of $SrTa_2O_6$. In another preferred embodiment, gate insulator 50 comprises a layer 51 of silicon dioxide and a layer 53 of $CeO_2$. In each of these cases, the layer of either $SrTa_2O_6$ or $CeO_2$ acts as the primary gate insulator and a buffer layer as well. In the preferred embodiment, ferroelectric 57 is a layered superlattice material, such as described in U.S. Pat. No. 5,519,234 issued May 21, 1996 to Paz de Araujo et al.; U.S. Pat. No. 5,434,102 issued Jul. 18,1995 to Watanabe et al.; U.S. Pat. No. 5,784,310 issued Jul. 22, 1998 to Cuchiaro et al.; and U.S. Pat. No. 5,840,110 issued Nov. 24, 1998 to Azuma et al., all of which are incorporated herein by reference as though fully disclosed herein. However, it may also be any other suitable ferroelectric material, such as an $ABO_3$-type perovskite. Floating gate 59 and gate 58 are preferably made of platinum, though they may be any other suitable conductor. As shown in FIG. 1, floating gate 59, which is sometimes referred to in the art as the bottom electrode, may be a multilayer structure which may include an adhesive layer 54 or 55, depending on the embodiment. The adhesion layer is typically titanium and preferably approximately 20 nm thick. The layer above the adhesion layer is preferably an approximately 100–200 nm thick, layer of platinum. Floating gate 59 may also include a barrier layer 56, which typically is $IrO_2$, preferably about 4 nm to 40 nm thick. The only essential parts of FET 40 are semiconductor 41, ferroelectric layer 57 and gate 58. The other layers are optional. One or more may be omitted in any specific embodiment. Further, the order of the layers 51–58 may be varied, and additional layers may be added.

It should be understood that the FIGS. 1, 3–4, and 14–16 depicting integrated circuit devices are not meant to be actual plan or cross-sectional views of any particular portion of an actual integrated circuit device. In the actual devices, the layers will not be as regular and the thicknesses will generally have different proportions. The figures instead show idealized representations which are employed to more clearly and fully depict the structure and process of the invention than would otherwise be possible. For example, if the various thicknesses of the layers were correct relative to one another, the drawing of the FET could not fit on the paper.

Terms of orientation herein, such as "above", "over", "top", "upper", "below", "bottom" and "lower", mean relative to semiconductor substrate 41. That is, if a second element is "above" a first element, it means it is farther from substrate 41, and if it is "below" another element then it is closer to substrate 41 than the other element. The long dimension of substrate 41 defines a substrate plane that is defined by the horizontal direction and the direction into and out of the paper in FIG. 1. Planes parallel to this plane are called a "horizontal" plane herein, and directions perpendicular to this plane are considered to be "vertical". A memory cell typically comprises relatively flat thin film layers. The terms "lateral" or "laterally" refer to the direction of the flat plane of the thin film layers. In FIG. 1, the lateral direction would be the horizontal direction. The term underlie and overlie are also defined in terms of substrate 41. That is, if a first element underlies a second overlying element, it means that a line perpendicular to the substrate plane that passes through the first element also passes through the second element.

This specification refers to a buffer layer located between a semiconductor and thin film of ferroelectric material. The term "between" does not mean that the buffer layer is in direct contact with the thin film of ferroelectric material or the semiconductor. The buffer layer may contact the ferroelectric or semiconductor, but typically, it does not. The term "on" is sometimes used in the specification when referring to the deposition or formation of an integrated circuit layer onto an underlying substrate or layer. In contrast to "between", the term "on" generally signifies direct contact, as is clear in the various contexts in which it is used.

In this disclosure, the terms "row" and "column" are relative terms that are used to facilitate the disclosure. That is, conventionally, a row is a horizontal line or alignment and a column is a vertical line or alignment. However, the invention contemplates that in any array, rows can become columns and columns can become rows simply by viewing the array from a perspective that is rotated by 90 degrees, 270 degrees, etc. Thus, because a memory architecture is rotated by 90 degrees, 270 degrees, etc., from the invention described in the summary of the invention, the specification, or claims herein, but otherwise is the same, does not take it outside of the architectures contemplated by the invention.

FIG. 2 shows the equivalent circuit for the preferred embodiment of the ferroelectric FET of FIG. 1. A voltage, Vs, is applied to source 42, voltage, Vb, is applied to substrate 41, a voltage, Vd, is applied to drain 44, and a gate voltage, Vg, is applied to gate 58. These voltages may either be a high or logic "1" voltage, a low, or logic "0" voltage, or an open or high resistance state, generally designated as "Z" herein. In the preferred embodiment of the read process, the drain voltage Vd can also take on a small positive value, which generally is significantly less than the high voltage.

FIG. 3 illustrates the state of polarization of ferroelectric material 57 and the resulting state of channel 46 for FET 40 for the "ON" state, while FIG. 4 illustrates the state of polarization of ferroelectric material 57 and the resulting state of channel 46 for FET 40 for the "OFF" state. For the sake of clarity, floating gate 59 and insulating material(s) 50 are not shown in these figures. In these figures, the circles with minus signs, such as 70, represent electrons; the circles with plus signs, such as 71, represent positive ions or vacancies; and the arrows, such as 72, represent the direction of polarization charge. If an electric field is applied to FET 40 in the upward direction in the figures, that is, if a high or logic "1" voltage is applied to gate 58 and a low or logic "0" voltage is applied to channel area 46, then ferroelectric material 57 will develop a polarization as shown in FIG. 3. Preferably, the high or logic "1" voltage is in the range from about 1 volt to 15 volts, and most preferably in the range of about 3–5 volts. Preferably, the low or logic "0" voltage is zero or the ground state. If the voltage across ferroelectric 57 is equal to or greater than the coercive voltage, essentially all the ferroelectric domains in the material 57 will become polarized as shown, but even a small voltage, e.g. 1.0 volt, will cause some domains to switch. The positive polarization charge above channel 46 will induce electrons into the channel, which, since electrons are the carriers in the n-type material, will greatly increase the conductivity of the channel. Assuming a drain bias, Vd, preferably in the range of about 0.5 volts to 8 volts, the increased conductivity of channel 46 will result in a greatly increased drain to source current, which is sensed to detect the "ON" state, which we will arbitrarily call a logic "1" state herein. If an electric field is applied to FET 40 in the downward direction in the figures, that is, if a logic "0" voltage is applied to gate 58 and a logic "1" voltage is applied to channel 46, then ferroelectric material 57 will develop a polarization as shown in FIG. 4. The negative polarization charge above channel 46 will induce a positive charge into the channel, which depletes the carriers in the n-type material, and will greatly decrease the conductivity of the channel. Assuming a drain bias, Vd, the decreased conductivity of channel 46 will result in a greatly decreased drain to source current, which is sensed to detect the OFF state, which we will arbitrarily call a logic "0" state herein.

FIG. 5 shows an idealized hysteresis curve, i.e. a graph of gate voltage versus drain current, of a ferroelectric FET, such as 40. In this graph, a positive voltage applied to channel region 46, as discussed above, is considered to be the same as a negative voltage applied to gate 58. Starting at a zero gate voltage, there is essentially no drain current, because the resistance in channel 46 is very high. As the gate voltage increases, there remains no drain current until a positive threshold voltage, +Vth, is reached. At this voltage, ferroelectric 57 switches into the ON state and attracts carriers into channel 46 causing a drain current. Then, as the gate voltage continues to increase, the drain current increases linearly along curve 80 until a saturation current is approached. After saturation, as the gate voltage increases, there is no increase in current, and the curve continues flat along line 82. As the gate voltage is decreased, the drain current remains the same until a negative threshold voltage, −Vth, is approached. Then the drain current decreases linearly along curve 86 until it approaches the point where the ferroelectric switches into the OFF state, at which point the drain current goes to zero. The drain current remains at zero no matter how large a negative voltage is applied, and, as the voltage is increased, does not rise above zero until the positive threshold voltage is reached.

The area between lines 79, 80, 84, and 86 is called the "memory window". To obtain a workable memory device, the width of the memory window, i.e. +Vth−−Vth, must be greater than the noise in gate electrode 58, and the height of the memory window, i.e. Isat, must be greater than the noise in the drain and associated sense circuit. For a non-volatile memory, the zero volts line should ideally be centered in the memory window, or at least well within the noise margins, since the device should retain the data without external power. A high ratio of Ids in the ON state and Ids in the OFF state is also desirable to permit ease of discrimination of the two states by the sensing circuit.

2. The Memory Architecture and Method of Operation

FIG. 6 shows a block electrical diagram of the preferred embodiment of a memory 200 according the invention. The memory 200 includes an array 210 of rows, such as 212, and columns, such as 214, of FET memory cells, such as 204. The electrical architecture of array 210 and the method of addressing the array are important aspects of the invention. Cell 204 can be any ferroelectric FET, but preferably is a ferroelectric FET as in FIG. 1 or FIGS. 14–16. Array 210 is shown as and 8×8 array of cells 204, or a 64-bit memory, though actual memories will generally be much larger. The portions of FIG. 6 that correspond to or connect with portions of a ferroelectric FET will be pointed out with respect to the corresponding parts of FIG. 1, but this could just as well be done with respect to the parts of FIGS. 14–16 or any other ferroelectric FET. Memory 200 includes eight word lines, such as 216; eight drain word lines, such as 218; and eight source lines, such as 220. As will be discussed below in more detail, each word line, such as 216, is a column select line for the write operation; each drain word line, such as 218, is a column select line for the read operation; and each source line, such as 220, is a row select line for both the write and read operations. Word line 216 is connected to gate electrode 58, source line 218 is connected to source contact 62, and drain word line 220 is connected to drain contact 64. In this embodiment, source line 218 is also connected to substrate contact 66, since the source and substrate are connected as shown at 222. Memory 200 also includes row address decoder/drivers 224, column address decoder/drivers 226 and 228, and sense amplifier 230. Row address decoder/driver 224 is connected to the eight source lines, such as 220, on which it places signals SE0, SE1 . . . SE7, respectively; each of the eight source lines is associated with a row of memory cells, such as 212, and is connected to each of the sources, such as 42, and substrates, such as 41, of the FETs, such as 40, in its associated row. Column address decoder/driver 226 is connected the eight word lines, such as 216, on which it places the signals WL0, WL1 . . . WL7, respectively; each of the eight word lines is associated with a column of memory cells, such as 214, and is connected to each the gates, such as 58, of the FETs, such as 40, in the associated column. Column address decoder 228 is connected to the eight drain word lines, such as 218, on which it places the signals DW0, DW1 . . . DW7, respectively; each of the eight drain word lines is associated with a column, such as 214, of memory cells, such as 204, and is connected to all the drains, such as 44, of the FETs, such as 40, in its associated row. Sense amplifier 230 is connected to the drain word lines, such as 218, so that it is able to determine whether or not a current is flowing in the line of the selected cell. As shown in ghost at 232, with a different signal arrangement than that discussed below, the sense amplifier could also be connected to the source lines. However, that arrangement is not preferred, as it can more easily lead to a disturb state. As known in the art, a row 212 of eight memory cells, such as 40, is collectively referred to as a "byte" 240 of memory, as indicated by the dashed rectangle. The invention contemplates many other embodiments related to the embodiment of FIG. 6. For example, the column address decoder/driver could be connected to the source of each FET in a column, and the row address decoder/driver could be connected to the gate or drain of each FET in a row. Sense amplifier 230 and column address decoder/driver 228 could be located on the same side of array 210 as decoder driver 226. For simplicity, memory 200 is shown as an 8×8 memory, that is a 64-bit memory, though, as known in the art, it can be made in much larger sizes. Sense amplifier 230 provides a data output signal on line 234 representative of the logic state of the selected memory cell. Preferably, data output line 234 is a cable and includes eight parallel lines, each of which carries an output signal representative of the logic state of one of the column select lines, such as 218. The output signal or signals depend on the current flow in the corresponding column select line, such as 218. In the embodiments described herein, the output signal is a logic "0" if the current in the column select line is essentially zero, and is a logic "1" if the current in the column select line is non-zero. However, in some embodiments the can be a small current in the column select line even if the selected ferroelectric transistor is in the OFF state, and in these instances a first, small current results in and output representative of the logic "0" state and a second, larger current results in an output representative of the logic "1" state. As indicated above, the logic states assigned to the different current flows are arbitrary and could be the opposite.

FIG. 6 shows the various elements of the FET, including gate 58, drain 44, source 42, and substrate 41, directly electrically connected to conducting lines 216, 218, 220 and 220, respectively. In this disclosure, "directly electrically connected" means that there is no other electrical component between the element and the conducting line. This direct electrical connection of the electrical elements of the FET to the select lines is an important aspect of the invention. However, in other aspects of the invention, it is possible that one or more of the gate 58, drain 44, source 42, and substrate 41 may be electrically connected to, but not directly electrically connected to, a select line; for example, a switch such as a transistor or diode may be placed between the element and the select line. Put another way, while this direct electrical connection is key in at least one aspect of the invention, there are other aspects where it is not critical.

One aspect of the invention in which the direct electrical connection is important, because it forms a key distinction over the prior art, is the feature that a row electrical element of the FET is directly electrically connected to the row select line; e.g., row electrical element 42, namely the source, is connected to row select line 220, namely the source line. Another feature is that a column electrical element of the FET is directly electrically connected to the column select line; e.g., column electrical element 58, namely the FET gate, is directly electrically connected to the column select line, namely, word line 216.

The preferred method of writing to and reading the cells in array 210 may be demonstrated utilizing Truth Tables 1 through 7 and the timing diagrams of FIGS. 7 through 13. As is conventional in the art, each of the Truth Tables 1 through 7 show the logic states of the word, source and drain word lines associated with the row and column of a selected cell or cells required to write a desired logic state into the selected cell or cells. The truth tables also show the logic states of the word, source and drain word lines associated with typical non-selected cells to illustrate that the non-selected cells will not be changed. As is conventional in the art, a timing diagram, such as FIG. 7, qualitatively illustrates the various voltage signals, such as WL0, WL1, SE0, etc., of interest in a memory. That is, a timing diagram is not intended to provide a precise indication of the voltages and times, but is only intended to provide a representation of the operation of the memory.

For any memory operation, to understand the signals applied to all the cells in array 210 and the resulting state of the cells, it is only necessary to describe the signals applied to four cells and the resulting state of the cells. For example, if the operation is a write to a byte, i.e., an operation that writes all cells in a row, we only need to understand: 1) the operation of writing a logic "1" to one cell of the selected byte and a logic "0" to one cell of the selected byte, since either a logic "1" or a logic "0" is written to every cell in the selected byte; and 2) the signals applied to one cell in the same column as the cell to which a logic "1" is written and one cell in the same column as the cell to which a logic "0" is written, since the operations in all non-selected rows is the same. Similarly, if the operation is a write or read of a single bit, we only need to know the signals applied to a selected bit and the result, the signals applied to a non-selected cell in the same row as the selected bit and the result, the signals applied to a non-selected cell in the same column as the selected bit and the result, and the signals applied to a non-selected cell in a non-selected row and non-selected column of the array, since these four combinations include every possible combination of signals and results possible in the array. Thus, we shall limit the discussion of the preferred writing and reading operations of memory 200 to a discussion of the signals applied to cells 204, 205, 206, and 207 of array 210 and the result of the application of the signals to these cells. As shown in FIG. 6, these signals are WL0, WL1, SE0, SE1, DW0, and DW1.

Figure 7:
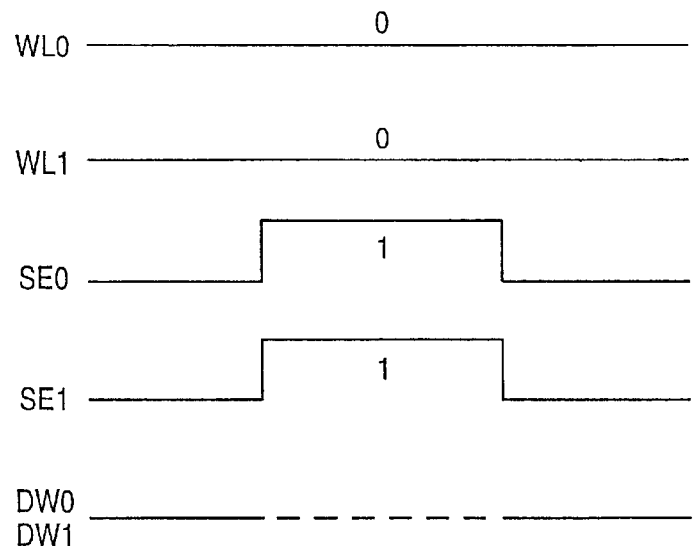
FIG. 7 is a timing diagram illustrating the signals applied to a representative portion of the memory array of FIG. 6 when writing "0", i.e. resetting the array.

One method of programming data into the memory of FIG. 6 is to write all cells to the logic "0" state, i.e., to reset the array to a logic "0", and then to write all the bits for which the data is a logic "1" to the logic "1" state. Providing the writing of a logic "1" to one cell does not change the data in the other cells; the result is that the array is programmed with the desired data. Truth Table 1 shows the WL0, WL1, SE0, SE1, DW0, and DW1 signals applied in the reset operation. FIG. 7 shows a timing diagram for these signals. Both the WL0 and WL1 signals are held at a logic "0" during the entire reset cycle. The SE0 and SE1 signals are both pulsed to a logic "1". The DW0 and DW1 signals are placed in the open or high resistance state, Z. This state is obtained by open circuiting the corresponding drain word line, such as 218, or connecting it to a high resistance, preferably, at least a gigaohm resistance. Typically, the resistance is from about one gigaohm to 100 gigaohms, and the higher the better. Turning to FIG. 6, with these applied signals gate 58 of transistor 40 is at a logic "0". The source and substrate are at a logic "1" and the drain is in a high resistance state, so channel 46 (FIG. 1) is at the logic "1" voltage. This polarizes the ferroelectric of memory cell 204 in the "OFF" or logic "0" state shown in FIG. 4. Since with these signals all the cells have the same voltages applied to their gates, sources, substrates and drains, the same result is obtained for memory cells 205, 206, and 207 as well as all the other cells in array 210.

TRUTH TABLE 1

| RESET ALL CELLS TO LOGIC "0" | |
| --- | --- |
| Signal(s) | Logic State |
| WL0 and WL1 | 0 |
| SE0 and SE1 | 1 |
| DW0 and DW1 | Z |

Figure 8:
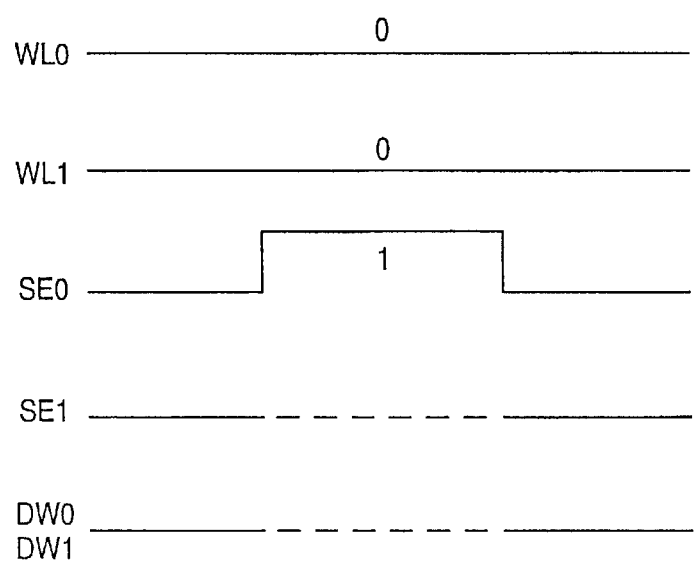
FIG. 8 is a timing diagram illustrating the signals applied in the memory array of FIG. 6 when writing "00", i.e., resetting a representative portion of a row of memory cells.

Another method of programming memory 200 is to program one byte at a time. This can be done by resetting all cells in the byte to a logic "0", and then writing a logic "1" to selected cells. Truth Table 2 shows the WL0, WL1, SE0, SE1, DW0, and DW1 signals applied in the reset one byte operation. FIG. 8 shows a timing diagram for these signals. Both the WL0 and WL1 signals are held at a logic "0" during the entire reset cycle. The SE0 signal is pulsed to a logic "1", while the SE1 signal is placed in the Z state. The DW0 and DW1 signals are also in the open or high resistance state, Z. Turning to FIG. 6, with these applied signals, gate 58 of transistor 40 is at a logic "0". The source and substrate are at a logic "1", and the drain is in a high resistance state, so channel 46 (FIG. 1) is at the logic "1" voltage. This polarizes the ferroelectric of memory cell 204 in the "OFF" or logic "0" state shown in FIG. 4. Since with these signals cell 206 and all the other cells in row 212 have the same voltages applied to their gates, sources, substrates and drains, the same result is obtained for memory cells 206 as well as all the other cells in row 212. However, since the source, substrate and drain of cell 205 are in the Z state, ferroelectric capacitor 60 formed by gates 59 and 58 and ferroelectric material 57 will act like a linear capacitor having a field applied to one electrode and the other electrode floating; that is, floating gate 59 will assume essentially the same voltage as gate 58, and there will be little or no electric field across ferroelectric material 57. Thus, its polarization state will not change. The same voltages are applied to the gate, source, substrate and drain of the FET of cell 207 and all the other cells in row 213, and therefore these cells do not change also. Similarly, all the other rows in array 210 are non-selected rows and have the same voltages applied to the FETS as the FETS of row 213, and thus none of the memory cells in the rest of the rows will change either.

TRUTH TABLE 2

Reset One Byte to Logic "0"

| Signal(s) | Logic State |
| --- | --- |
| WL0 | 0 |
| WL1 | 0 |
| SE0 | 1 |
| SE1 | Z |
| DW0 and DW1 | Z |

Figure 9:
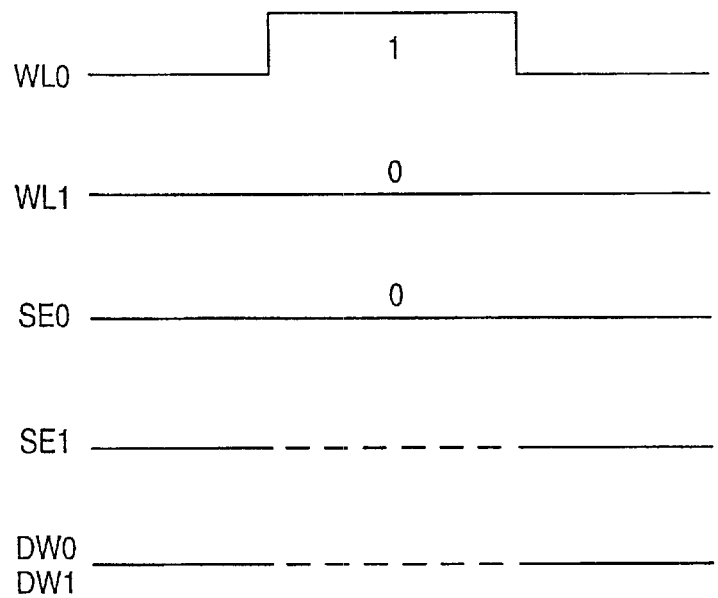
FIG. 9 is a timing diagram illustrating the signals applied to a representative portion of the memory array of FIG. 6 when writing "10"

After a byte is reset as discussed above, one preferred way of writing data into the byte is by writing the whole byte at one time. Truth Table 3 shows the WL0, WL1, SE0, SE1, DW0, and DW1 signals applied when logic "1" is written to one bit of the byte and a logic "0" is written to an adjacent bit of the byte. FIG. 9 shows a timing diagram for these signals. The WL0 signal is pulsed to a logic "1" while the WL1 signal is held at a logic "0" during the entire write cycle. As indicated in the truth table, alternatively, it can be held in the Z state. The SE0 signal is also held to a logic "0", while the SE1 signal is placed in the Z state. The DW0 and DW1 signals are also in the open or high resistance state, Z. Turning to FIG. 6, with these applied signals, gate 58 of transistor 40 is at a logic "1". The source and substrate are at a logic "0", and the drain is in a high resistance state, so channel 46 (FIG. 1) is at the logic "0" voltage. This polarizes the ferroelectric of memory cell 204 in the "ON" or logic "1" state shown in FIG. 3. However, the gate of the FET of cell 206 will be at the logic "0" state. Since the source and substrate, and thus the channel, are also in the logic "0" state, there will be no voltage drop across the ferroelectric in this cell, and it will remain in the logic "0" state. In the alternative case, the gate is in the Z state, the source and substrate are in the logic "0" state, and the drain is in the Z state. In this case, both gates 59 and 58 are floating; capacitor 60 of this cell acts like a linear capacitor, and balances the charges on the two gates, so that again there is essentially no voltage drop across the ferroelectric and no change of state. All other cells in the selected row, i.e., row 212, will have the same signals applied to them as cell 206. Cell 205 will have its gate at a logic "1" and its source, substrate and drain in the Z state, and, as discussed above, its floating gate 59 will assume essentially the same voltage as gate 58; there will be no voltage drop across the ferroelectric, and no change in state in the cell. Cell 207 will have its gate at a logic "0" and its source, substrate and drain in the Z state, and, as discussed above, will not change its state. Alternatively, its gate, source, substrate and drain all will be in the Z state, which also will cause no change of state. All other cells in the non-selected row, i.e., row 213, will have the same applied voltages as cell 207, and therefore will not change. All other rows will operate as row 213, and therefore none of the other cells will change either.

TRUTH TABLE 3

Write "10"

| Signal(s) | Logic State |
| --- | --- |
| WL0 | 1 |
| WL1 | 0 or Z |
| SE0 | 0 |
| SE1 | Z |
| DW0 and DW1 | Z |

Figure 10:
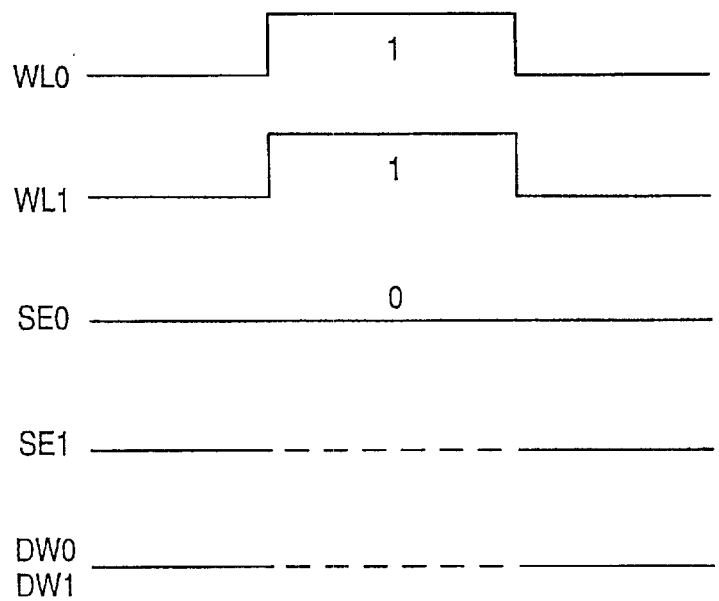
FIG. 10 is a timing diagram illustrating the signals applied to a representative portion of the memory array of FIG. 6 when writing "11"

Truth Table 4 shows the WL0, WL1, SE0, SE1, DW0, and DW1 signals applied when a logic "1" is written to adjacent bits of a byte, such as cells 204 and 206 of byte 240. FIG. 10 shows a timing diagram for these signals. Both the WL0 signal and the WL1 signal are pulsed to a logic "1". The SE0 signal is also held to a logic "0", while the SE1 signal is placed in the Z state. The DW0 and DW1 signals are also in the open or high resistance state, Z. Turning to FIG. 6, with these applied signals, gate 58 of transistor 40 is at a logic "1". The source and substrate are at a logic "0", and the drain is in a high resistance state, so channel 46 (FIG. 1) is at the logic "0" voltage. This polarizes the ferroelectric of memory cell 204 in the "ON" or logic "1" state shown in FIG. 3. The same voltages as just described with regard to cell 204 are also applied to the FET of cell 206, with the same result; it will be polarized in a logic "1" state. Cell 205 will have its gate at a logic "1" and its source, substrate and drain in the Z state, and therefore, as discussed above, its floating gate 59 will assume essentially the same voltage as gate 58; there will be no voltage drop across the ferroelectric, and no change in state in the cell. The same voltages as just described with regard to cell 205 are also applied to the FET of cell 207, with the same result; it will not change its state. All other cells in the selected row, i.e., row 212, will have their word line at logic "0" or in Z state and will operate as did cell 206 in the write "10" state example above, and therefore they will not change either. Cell 205 will have its gate at a logic "1" and its source, substrate and drain in the Z state, and, as discussed above, its floating gate 59 will assume essentially the same voltage as gate 58; there will be no voltage drop across the ferroelectric, and no change in state in the cell. Cell 207 will have the same voltages applied to it and therefore also will not change its state. All other cells in the non-selected row, i.e., row 213, will have the same applied voltages as cell 207 in the write "10" example, and therefore will not change. All other rows will operate as row 213, and therefore none of the other cells will change either.

TRUTH TABLE 4

Write "11"

| Signal(s) | Logic State |
| --- | --- |
| WL0 | 1 |
| WL1 | 1 |
| SE0 | 0 |

TRUTH TABLE 4-continued

Write "11"

| Signal(s) | Logic State |
|---|---|
| SE1 | Z |
| DW0 and DW1 | Z |

Figure 11:
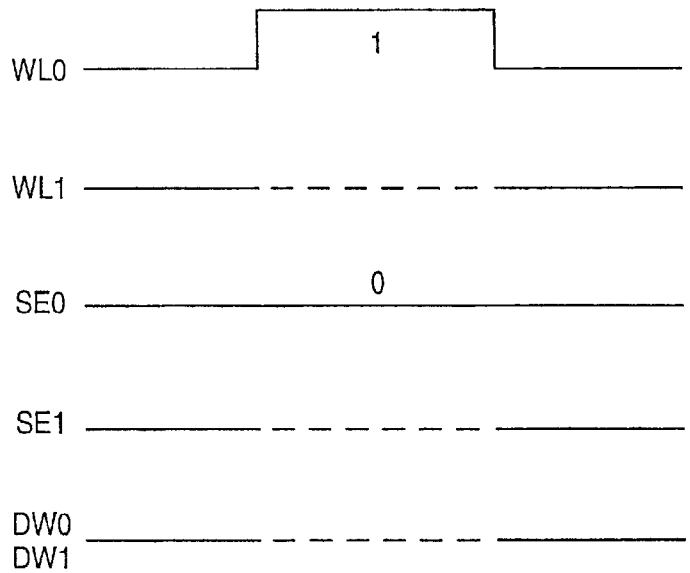
FIG. 11 is a timing diagram illustrating the signals applied to a representative portion of the memory array of FIG. 6 when writing "1" to a single bit in the array.
Figure 12:
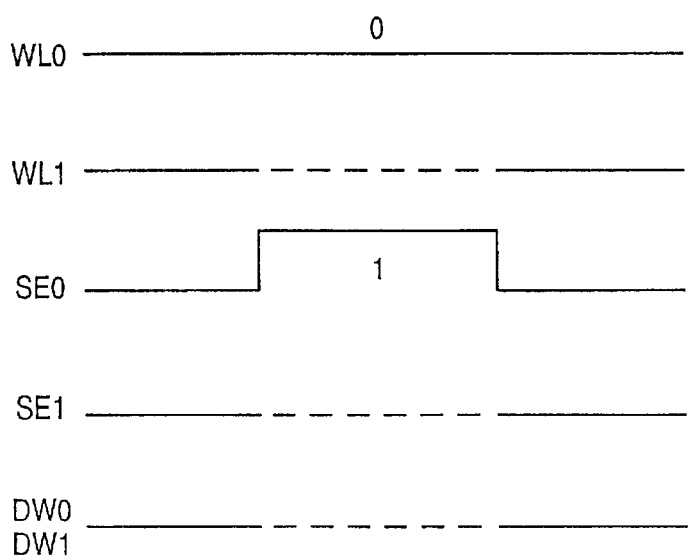
FIG. 12 is a timing diagram illustrating the signals applied to a representative portion of the memory array of FIG. 6 when writing "0" to a single bit in the array.
Figure 13:
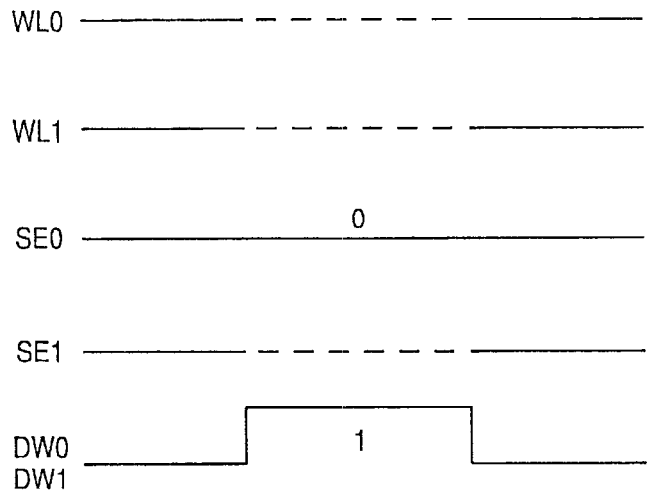
FIG. 13 is a timing diagram illustrating the signals applied to a representative portion of the memory array of FIG. 6 when reading a single bit in the array.

A feature of the invention is that the memory according to the invention can also be addressed, written to, and read as a purely random access memory. That is, any bit can be independently written to and read without affecting any other bit. Truth tables 5, 6, and 7 and FIGS. 11, 12 and 13 illustrate this mode of operating memory 200. Truth Table 5 shows the WL0, WL1, SE0, SE1, DW0, and DW1 signals applied when a logic "1" is written to a single bit, i.e., cell 204. FIG. 11 shows a timing diagram for these signals. The word line of the selected cell, i.e., the WL0 signal, is pulsed to a logic "1", while the word lines of the non-selected cells, e.g., cell 206, are set in the Z state. The source line of the selected cell, i.e., the SE0 signal, is held at a logic "0", while the source lines of the non-selected cells, e.g., the SE1 signal, are placed in the Z state. The DW0 and DW1 signals are also in the open or high resistance state, Z. Turning to FIG. 6, with these applied signals, gate 58 of transistor 40 is at a logic "1". The source and substrate are at a logic "0", and the drain is in a high resistance state, so channel 46 (FIG. 1) is at the logic "0" voltage. This polarizes the ferroelectric of memory cell 204 in the "ON" or logic "1" state shown in FIG. 3. All non-selected cells in the selected row, such as cell 206, will have their gates in the Z state, their sources and substrates in the logic "0" state, and their drains in the Z state. Therefore, as discussed above, both gates 59 and 58 of the non-selected cells are floating; capacitor 60 of these cells acts like a linear capacitor, and balances the charges on the two gates, so that again there is essentially no voltage drop across the ferroelectric and no change of state. Cell 205 will have its gate at a logic "1" and its source, substrate and drain in the Z state. Therefore, ferroelectric capacitor 60 formed by gates 59 and 58 and ferroelectric material 57 for this cell will act like a linear capacitor having a field applied to one electrode and the other electrode floating; that is, floating gate 59 will assume essentially the same voltage as gate 58, and there will be little or no electric field across ferroelectric material 57. Thus, its polarization state will not change. Cell 207 and all other cells in row 213 will have their gates, sources, substrates and drains all in the Z state, and therefore, they will have no voltage across the ferroelectric material and its polarization state will not change. The cells in all other non-selected rows will have the same voltages applied to them and behave the same way as the cell in the same column in row 213, and thus none of these remaining cells will change state.

TRUTH TABLE 5

Write One Bit to Logic "1"

| Signal(s) | Logic State |
|---|---|
| WL0 | 1 |
| WL1 | Z |
| SE0 | 0 |
| SE1 | Z |
| DW0 and DW1 | Z |

Truth Table 6 shows the WL0, WL1, SE0, SE1, DW0, and DW1 signals applied when a logic "0" is written to a single bit, i.e., cell 204. FIG. 12 shows a timing diagram for these signals. The word line of the selected cell, i.e., the WL0 signal, is held at a logic "0", while the word lines of the non-selected cells, e.g., cell 206, are set in the Z state. The source line of the selected cell, i.e., the SE0 signal, is held at a logic "1", while the source lines of the non-selected cells, e.g., the SE1 signal, are placed in the Z state. The DW0 and DW1 signals are also in the open or high resistance state, Z. Turning to FIG. 6, with these applied signals, gate 58 of transistor 40 is at a logic "0". The source and substrate are at a logic "1", and the drain is in a high resistance state, so channel 46 (FIG. 1) is at the logic "1" voltage. This polarizes the ferroelectric of memory cell 204 in the "OFF" or logic "0" state shown in FIG. 4. All non-selected cells in the selected row, such as cell 206, will have their gates in the Z state, their sources and substrates in the logic "1" state, and their drains in the Z state. Therefore, as discussed above, both gates 59 and 58 of the non-selected cells are floating; capacitor 60 of these cells acts like a linear capacitor, and balances the charges on the two gates, so that again there is essentially no voltage drop across the ferroelectric and no change of state. Cell 205 will have its gate at a logic "0" and its source, substrate and drain in the Z state. Therefore, the ferroelectric capacitor 60 formed by gates 59 and 58 and ferroelectric material 57 will act like a linear capacitor having a field applied to one electrode and the other electrode floating; that is, floating gate 59 will assume essentially the same voltage as gate 58, and there will be little or no electric field across ferroelectric material 57. Thus, its polarization state will not change. Cell 207 and all other cells in row 213 will have their gates, sources, substrates and drains all in the Z state, and therefore, they will have no voltage across the ferroelectric material and its polarization state will not change. The cells in all other non-selected rows will have the same voltages applied to them and behave the same way as the cell in the same column in row 213, and thus none of these remaining cells will change state.

TRUTH TABLE 6

Write One Bit to Logic "0"

| Signal(s) | Logic State |
|---|---|
| WL0 | 0 |
| WL1 | Z |
| SE0 | 1 |
| SE1 | Z |
| DW0 and DW1 | Z |

Truth Table 7 shows the WL0, WL1, SE0, SE1, DW0, and DW1 signals applied when a single bit, i.e., cell 204, is read. FIG. 13 shows a timing diagram for these signals. All word lines, e.g., the WL0 and WL1 signals, are in the Z state. The source line of the selected cell, i.e., the SE0 signal, is held at a logic "0", while the source lines of the non-selected cells, e.g., the SE1 signal, are placed in the Z state. All drain word lines, e.g., the DW0 and DW1 signals, are held at a logic "1". For the read function, the logic "1" state is generally at a lower voltage than the logic "1" signal for write functions. Preferably, this voltage is from 0.5 volts to 2 volts, and most preferably about 1.5 volts. Turning to FIG. 6, with these applied signals in all cells in the non-selected rows, the source and substrate is in the high resistance or open circuit state, and the drain is at about 1.5 volts. Therefore, little or no current will flow through channels 46 (FIG. 1) of these cells, because of the high source resistance. Since gates 58 of these cells are in the Z state, both floating gates 44 and gates 58 are floating; capacitor 60 will act like a linear capacitor, and there will be little or no voltage across ferroelectric material 57, and the read function will not alter the state of these cells. Gate 58 of transistor 40 is in the high resistance, or open, circuit state, source 42 and substrate 41 are at zero volts, and drain 44 is at about 1.5 volts. As discussed above, if ferroelectric material 57 is polarized in the logic "1", or ON, state, a current will flow in through channel 46 (FIG. 1) and through lines 220 and 218. If ferroelectric material 57 is polarized in the logic "0", or OFF, state, little or no current will flow through its channel 46 into line 218. Thus, since there is little or no contribution to the current in line 218 from the cells of the non-selected rows, the current in line 218 is a measure of whether cell 204 is in the logic "1" or logic "0" state; if there is significant current, cell 204 is in the logic "1" state, and if there is little or no current, cell 204 is in the logic "0" state. The current in line 218 is sensed by current sens amplifier 230, which outputs a high or logic "1" signal if current flows in line 218 and a low or logic "0" signal if current does not flow in line 218. All the cells in the selected row, i.e. row 212, will have the same voltages applied to them as the selected cell, and therefore, the currents flowing in the other drain word lines will also be a measure of the logic state of the corresponding cells in the selected row. Thus, it can be seen that an entire byte can be read at once. If it is desired to read only one cell in the byte at a time, this can be done simply by setting the drains of the non-selected columns to the Z state, or to a logic "0" state. Although there will be a small voltage in the channel of cells that are being read, very little of this voltage will be seen across ferroelectric 57 for two reasons: 1) much of the voltage will fall across the gate insulator; and 2) since both the electrodes of ferroelectric capacitor 60 are floating, whatever voltage does show up on floating gate 59 will be balanced by a corresponding voltage on gate 58, created by linear capacitance action. Thus, the state of selected cells will not change either.

As indicated in Truth Table 7, the word line signals, WL0/WL1, may also be in the logic "0" state. If this alternative is used, the selected source line, SE0, is in a logic "0" state also, so there is not disturb. The non-selected source lines, such as SE1, are in the high resistance or "Z" state, and again there is no change. However, since the drains have a small positive voltage on them, there is a potential disturb issue. Thus, it is preferred that the word lines, such as 216, be in the Z state.

TRUTH TABLE 7

Read One Bit

| Signal(s) | Logic State |
|---|---|
| WL0 and WL1 | Z or 0 |
| SE0 | 0 |
| SE1 | Z |
| DW0 and DW1 | 1 |

Summarizing the operation, the word lines, such as 216, are column select lines for the write operation; the drain word lines, such as 218, is a column select line for the read operation; and the source lines, such as 220, are row select lines for both the write and read operations. In the drawings, the signals on the word lines are indicated by WLn, and the signals on the drain word lines are indicated by DWn, where n is the number of the column, starting with the left column as a "0". The signals on the source lines are indicated by SEm, the "SE" standing for select, where m is the number of the row, starting with the top row as a "0". In one embodiment, the whole memory array is reset to a logic "0" before programming. This is done so that only logic "1"s are needed to write in the memory cells, while logic "0"s have been stored as defaults. This mode of operation can also be done in a byte addressing mode, that is, one byte at a time. In this byte addressing mode, before writing a byte, the byte is reset to all logic "0"s. A feature of the method is that during writing, the drain word lines are floating, or high resistance states. Here, "floating state" means an open circuit, though in a practical memory it would usually be implemented by connecting the line that is to be "floating" to the high resistance output of a buffer or operational amplifier. Thus, it is referred to alternatively as the "high resistance" or "Z" state. To write a logic "1" into a specific bit, its column select line signal, WLn, must be a high (logic "1") and its row select line signal, SEm, must be low (logic "0"). In the modes that include a reset function, logic "0" does not need to be written into a specific bit, because logic "0" is its default value; however, its state must not change. If a reset is used, the writing operation can be addressed by byte or by bit. In the byte addressing mode, to select a byte, $B_m$, the mth row select line signal, SEm, is set to a logic "0" if any logic "1" states are to be written into the byte, and to logic "1" if a logic "0" is to be written to all bits of the byte; all other row select lines are floating (Z state). In the bit addressing mode, to select the bit $B_{mn}$, the mth row select line signal, SEm, is set to a logic "0" if a logic "1" is to be written and to a logic "1" if a logic "0" is to be written; the nth column select line signal, WLn, is set to the logic state to be written; all other row select lines and column select lines are floating (Z state). The bit writing operation is a true random access process. In the reading process, all word lines are floating; that is, their signal is the Z state, and all column select line signals, DWn, are high (logic "1"). The byte is selected by setting its select line signal, SEm, to low (logic "0"). All other select lines are floating; that is, their signal is in the Z state. The read operation is also a true random access operation, since any specific cell can be read by selecting its row and reading its column.

A feature of the invention is that both the memory and its operation are simple. The memory cell architecture for either the read function or write function is simply a single FET, with one electrical element of the FET connected to a row select conducting line, and another electrical element of the FET connected to a column select conducting line. The reading method is particularly simple. One electrical element of the selected FET, preferably the source, is placed in a first electronic state, which preferably is a voltage state or a resistance state, and the same electrical element of the non-selected FETs is placed in a second electrical state different from the first electrical state. A current source is connected to the conducting line to which the first element is connected, and the current flow in the conducting line is used to determine the logic state of the selected cell. That is, a first logic state is assigned to the selected memory cell if the current flow is a first current flow and a second logic state to the selected memory cell if the current flow is a second current flow.

Figure 14:
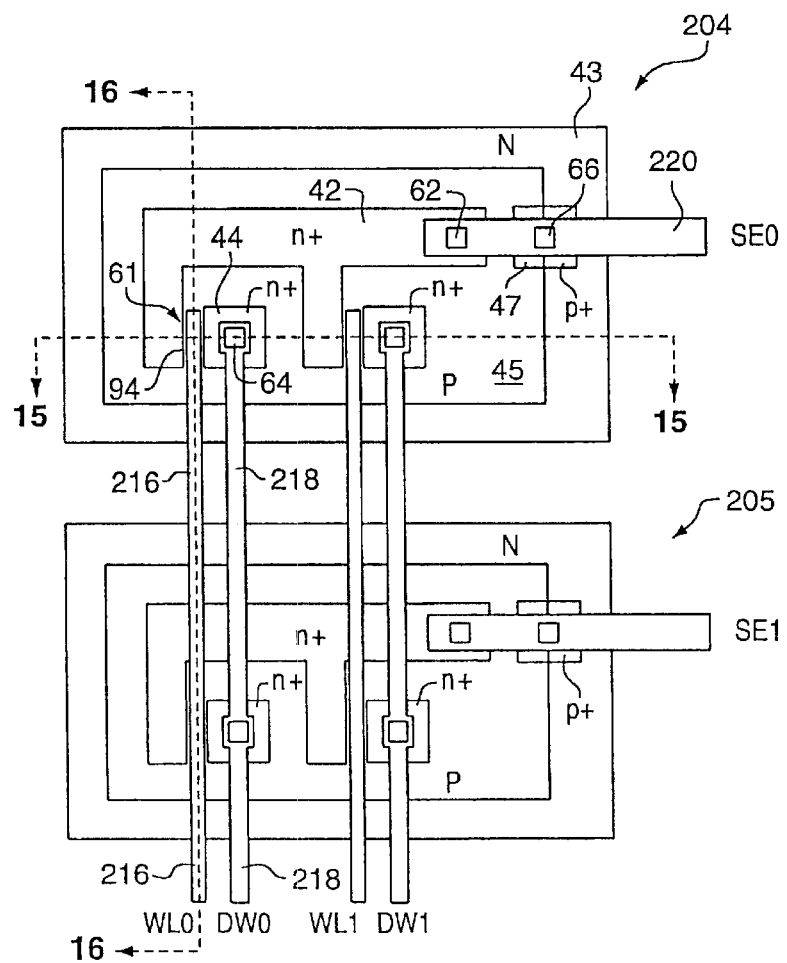
FIG. 14 shows a portion of the layout of the preferred embodiment of a memory according to the invention.
Figure 15:
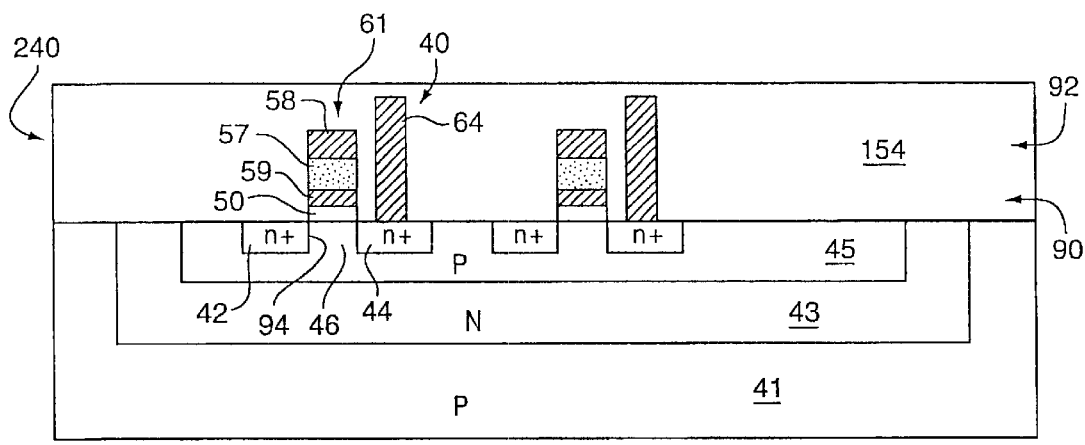
FIG. 15 shows a cross-sectional view of the ferroelectric FET of FIG. 14 through the line 15—15 of FIG. 14.
Figure 16:
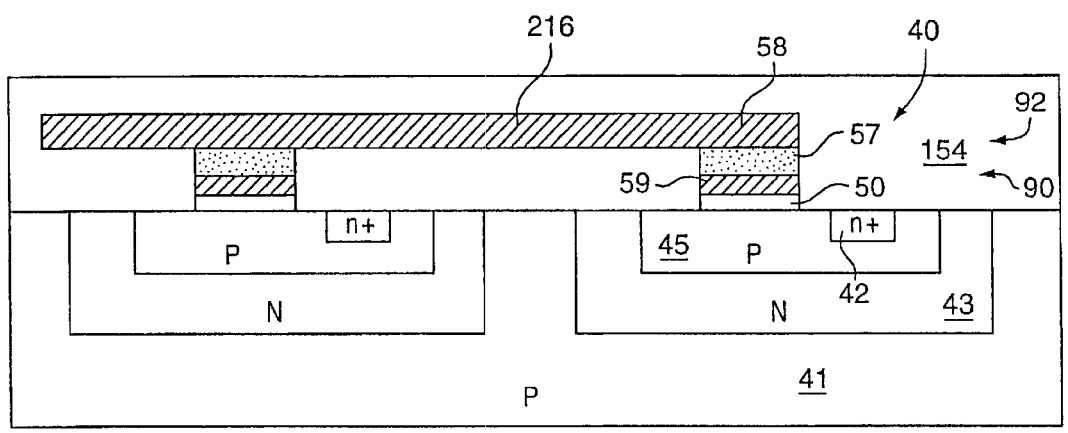
FIG. 16 shows a cross-sectional view of the ferroelectric FET of FIG. 14 through the line 16—16 of FIG. 14.

A feature of the invention is that the structure of the FET 40 and the addressing architecture shown in FIG. 6 lead to a very dense memory. This feature can best be understood utilizing a layout of a typical pair of adjoining memory cells, 204 and 205, as shown in FIG. 14, together with cross-sections through these cells, which cross-sections are shown in FIGS. 15 and 16; that is, FIG. 15 is a cross-section through line 15—15 of FIG. 14 and FIG. 16 is a cross-section through line 16—16 of FIG. 14. The FET 40 of FIGS. 14–16 is identical to the FET of FIG. 1, except insulating layer 50 and floating gate 59 are shown as a single layer. Therefore, corresponding parts are numbered the same. FIG. 14 shows a layout including two memory cells in the same column, e.g., memory cells 204 and 205. FIG. 15 shows a cross-section through line 15—15 of FIG. 14, while FIG. 16 is a cross-section through line 16—16 of FIG. 14. The parts of each cell that have been previously shown and discussed in connection with FIGS. 1 and 6 will not be repeated. In this embodiment, while the doping for deep-well 43 and shallower well 45 and drain 44 are rectangular, the doping area of source 42 is F-shaped. The preferably p-type, doped active area 47 for substrate contact 66 is located along source line 220 so that source 42 and substrate are easily connected. The word lines, such as 216, are preferably made of platinum, while the drains lines, such as 218, and the source lines, such as 220, as well as the contacts, such as 64, are preferably made of aluminum, tungsten, or other conventional metallization material. The word lines, such as 216, are integral with gate 58, as can best be seen in FIG. 16. As can be seen best in FIG. 15, all the FETs in the same byte, such as 240 (FIG. 6), share the same shallow well 45, which increases manufacturing efficiency as well as density. For simplicity, only a one cell byte is shown in FIG. 15 and a two cell byte is shown in FIG. 16. As known in the art, usually there will be eight or more cells in a byte.

Figure 17:
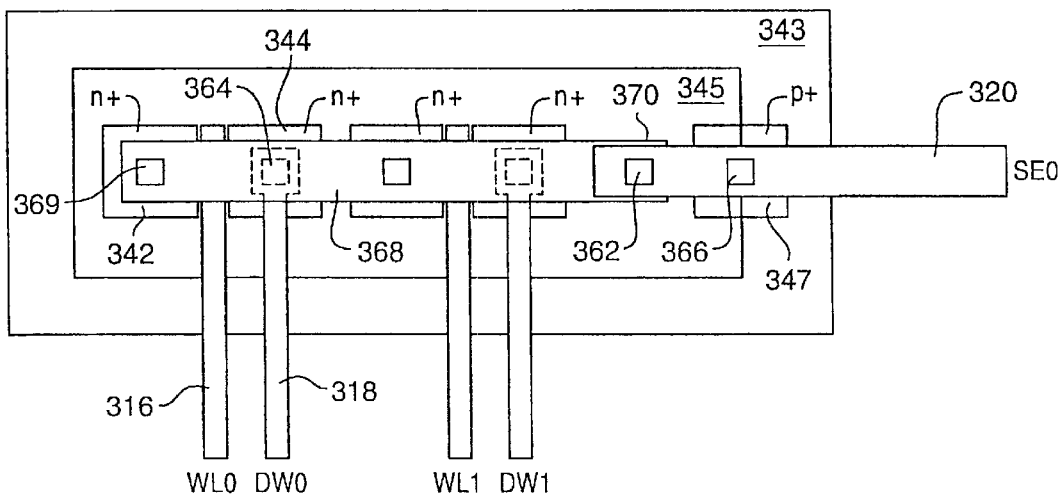
FIG. 17 shows a portion of the layout of an alternative preferred embodiment of a memory cell according to the invention.

FIG. 17 shows an alternative layout of the memory 200 according to the invention. Again, only a two cell byte is shown for simplicity. This embodiment, like the embodiment of FIG. 14 includes a deep well, 343, which is preferably, an N-well, and a less deep well 345, which is preferably a P-well. However, in this embodiment, the sources, such as 342, and the drains, such as 344, are both rectangular in shape and their wiring layer plug contacts, such as 369 and 364, respectively, are aligned in a line. The source line 368 is connected to these contacts 369, and at one end 370, a second wiring plug 362, makes contact with the source line extension 320, which also contacts the substrate contact 366. As in the embodiment of FIG. 14, substrate contact 366 is a wiring plug that contacts active area 347, which is preferably p-type. As in the embodiment of FIG. 14, the word lines, such as 316, are preferably platinum, though other conductors may be used, and the drain lines, such as 318, and the source lines, such as 369, and source line extensions, such as 320, are made of aluminum, tungsten, or other conventional wiring layer material. As can be seen from the layout, the density of the layout of FIG. 17 is even greater than the layout of FIG. 14. The primary reason for this difference is that the embodiment of FIG. 17 utilizes a multilevel metallization structure. That is, the metallization layers in which the word lines, such as 316, the drain lines, such as 318, and the source lines, such as 368, are defined are at different levels in the structure. In the vertical direction, that is the direction away from the substrate 341 and out of the paper in FIG. 17, the metal layer sequence is word line, drain line, then source line. The drain line contacts, such as 364 are dotted, since they are underneath the source line 368. An intermetallization dielectric similar to insulator 92 in FIGS. 15 and 16, separates these metallization layers. Source extension 320 is shown in a layer even further from the substrate than the source line, but it could be defined in the same metallization layer in which drain lines 318 are defined.

A feature of the invention is that source/drains 42 and 44 do not underlie gate structure 61. If source/drains 42 and 44 underlie gate structure 61, the probability of a disturb of the ferroelectric polarization state increases. This is particularly true of drain region 44. As discussed above, during the read process, the drain is at a voltage in a range from 0.5 volts to 2 volts. If a portion of the drain underlies a portion of the gate, the portion of ferroelectric layer 57 that overlies the drain would have a significantly increased chance of switching or partially switching. On the other hand, if no portion of drain 44 underlies ferroelectric layer 57, the voltage at the drain falls off rapidly under gate structure 61, and the probability of disturbing the state of ferroelectric layer 57 drops precipitously. In prior art methods of making FET 40, it was very difficult to avoid a portion of source/drains 42 and 44 from underlying gate structure 61, since gate structure 61 was defined well after the formation of the source/drains, and therefore small misalignments were hard to avoid. As will be discussed further below, the invention provides a self-aligned process for forming the active areas, such as source/drains 42 and 44, that overcomes this problem.

Another feature of the invention is that drain word lines 218, 318 are parallel to word lines 216, 316. This feature assists in making the memory array easy to fabricate and dense.

It should be understood that other layouts and cell structures than those shown in FIGS. 14–17 may be used.

3. The Fabrication Process

Figure 18:
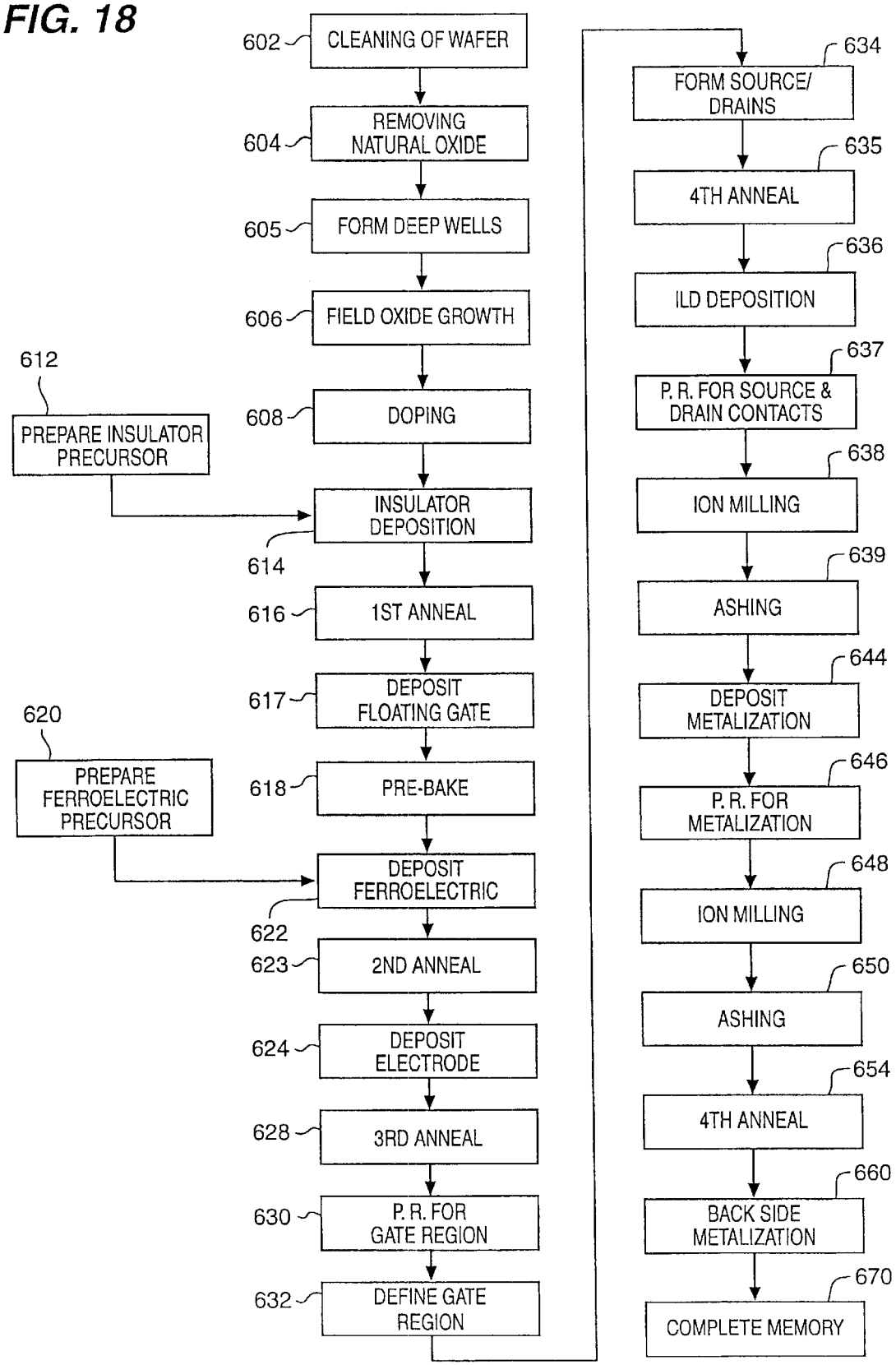
FIG. 18 is a flow chart of the preferred process for fabricating the ferroelectric FET of FIGS. 14–16.

A flow chart showing the steps of a preferred process for fabricating a memory 200 (FIG. 6) including FET 40 (FIGS. 14–16) according to the invention is shown in FIG. 18. The word "substrate" is often used ambiguously in the art. It can mean the underlying wafer 441 on which an integrated circuit is formed, as well as any object on which a thin film layer is deposited. In this disclosure, "substrate" shall mean the object to which the layer of interest is applied; for example, when we are talking about a ferroelectric layer, such as 57, the substrate includes layers 41, 52, and 59 on which the ferroelectric layer is formed. In the art, the word "precursor" can mean a solution containing one metal which is mixed with other "precursors" to form the solution to be applied to the substrate, or the solution which is applied to a substrate. In this discussion, we shall generally refer to the individual precursors that are mixed to form the solution that is applied to the substrate as "initial precursors" and the precursor as applied to the substrate as the "final precursor" or just "precursor", unless the meaning is clear from the context. In intermediate stages, the solution may be referred to as the "intermediate precursor". The term "thin film" is used herein as it is used in the integrated circuit art. Generally, it means a film of less than a micron in thickness. The thin films disclosed herein are in all instances 0.5 microns in thickness or less. These thin films of the integrated circuit art should not be confused with the so called "thin films" in layered capacitors of the macroscopic capacitor art which are formed by a wholly different process which is incompatible with the integrated circuit art.

In step 602, a wafer 41 is provided and cleaned to remove contaminants, preferably by dipping the wafer into $H_2SO_4$ for 30 minutes. Then, in step 604, the wafer is dipped into 10:1 BOE for five minutes, which removes any natural oxide that may have formed on the wafer. Deep wells 43 and 45 are then formed in step 605 in a conventional manner, such as by diffusion. In step 606, field oxide 90 is grown in a furnace, preferably to a thickness of 500 nanometers (nm). In FIGS. 15 and 16 the field oxide has become integrated into the passivation layer 154, since they are made of essentially the same material. As known in the art, this process also serves to drive in the deep wells. The active areas, including source/drain regions 42 and 44 and channel region 46, may then be formed by a conventional doping method in step 608. In the preferred embodiment, only channel region 46 is formed in this step, and the source/drains are completed later in step 634. The channel doping is preferably applied over the whole region that will later be occupied by source 42, drain 44, and channel 46, to prevent misalignment of source/drains 42, 44 and channel 46 in step 634. That is, the doping in step 608 is at the level that will form channel 46, and the later step 634 increases the doping in regions 42 and 44 to the appropriate level for the source/drains. Step 608 includes the usual photo resist, etching and strip steps for removal of the field oxide followed preferably by a phosphorous diffusion step. Preferably, the doping of channel region 46 is in the range of $2 \times 10^{15}$ to $10^{17}$ atoms/cm$^3$, and most preferably in the of range $10^{16}$ to $10^{17}$ atoms/cm$^3$, which provides a resistance of about 1 ohm to 5 ohms. Preferably, the doping of the source/drain regions is in the range of $10^{19}$ to $10^{20}$ atoms/cm$^3$, whether they are formed in this step or later.

In steps 612 and 620, the initial precursors for depositing insulator 50 and ferroelectric 57, respectively, are formed. These may be formed by interacting each of the metals, e.g., cerium for buffer layer 52, tantalum for gate insulator 53, and strontium, bismuth and tantalum for the ferroelectric, or an alkoxide of the metal with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction.

In the preferred embodiment, cerium oxide, $CeO_2$, is used as buffer layer 52, and either tantalum oxide ($Ta_2O_5$) or strontium tantalate ($SrTa_2O_6$) for gate insulator 53. For the FETs actually made, a commercially available cerium 2-ethylhexanoate in 2-ethylhexanoic acid was used, i.e. 12.08 weight percent Ce available from Strem Company (Lot No. 136599-S). An amount of this solution equal to 23.2042 grams was weighed into a 125 ml (milliliter) Erlenmeyer flask and 75 ml of n-octane was added. This was stirred at room temperature to dissolve the cerium compound in the n-octane, which formed a pale yellow solution immediately. Next, this solution was poured into a 250 ml graduated cylinder and diluted to 200.0 ml with additional n-octane. This solution was then filtered through a 0.2 micron filter into a 250 ml bottle to form the final cerium precursor. Other insulators may be used, such as yttrium oxide and lanthanum oxide.

In the preferred embodiment, a layered superlattice material, such as described in the patents referenced above, is used. The typical precursor for making layered superlattice materials currently preferred by those skilled in the art has the stoichiometric formula $SrBi_{2.18}Ta_{1.44}Nb_{0.56}O_9$. This precursor includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. As explained in the above patents, strontium is considered to be an "A-site" element in the above formula, and tantalum and niobium are considered "B-site" elements, while the bismuth is the superlattice generator element. One feature of the invention is that a final layered superlattice compound with excess B-site and/or superlattice generator metals has a lower dielectric constant and is, therefore, preferred as the ferroelectric. A-site poor, that is, A-site deficient, compounds are preferred. Specifically, the most preferred materials are: strontium poor strontium bismuth tantalate, and strontium poor strontium bismuth tantalum niobate. Preferably, the strontium is present in a proportion of between 0.5 times to 1.0 times its normal stoichiometric concentration. In the experimental examples discussed below, however, strontium bismuth tantalate having the final formula $SrBi_2Ta_2O_9$ was used. Electrode 58 is preferably platinum, but may be other metals or conductors also.

In step 614, insulator films 51, 52, and 53 are formed. Silicon dioxide layer 51 may be thermally grown, or formed, in one or more of the four annealings described below. Insulator thin films 52 and 53 and ferroelectric thin film 57 are preferably applied in steps 614 and 622, respectively, using a liquid deposition technique, such as spin-coating or a misted deposition method as described in U.S. Pat. No. 5,546,945 issued Oct. 10, 1995 to Larry D. McMillan et al. In the examples made, a spin-on technique was used to form the thin films. In the examples made, the technique of deposition, drying, and rapid thermal processing (RTP) as described in the above patents was performed for one layer of cerium oxide to form insulator 52, while the same deposition technique for five layers was used to form the strontium bismuth tantalate. After deposition, drying and RTP, in step 616 cerium oxide film 52 on the substrate is annealed, preferably at a temperature of between 600° C. and 850° C. for from 30 minutes to four hours; the samples made were annealed at 800° C. for 1.5 hours in oxygen. Floating gate 59 is then formed in step 617, preferably by sputtering an approximately 100 nm layer of platinum. In a variation of the process, the floating gate comprises a layer of polysilicon. In this variation, the source/drains 42 and 44 can be formed immediately thereafter, with a process as described below in connection with step 634. That is, step 634 may be performed immediately after step 617. In this variation, the doping of the active areas 42 and 44 to from the source/drains, also dopes the polysilicon gate to make it highly conducting. Which ever option is chosen, it is followed by optional step 618, in which the wafer is prebaked in oxygen at between 500° C. and 800° C. for from 15 minutes to two hours. In the variation in which a polysilicon gate 54 is formed and then doped in the step in which the active areas 42 and 44 are formed, this bake helps to drive the dopants into the silicon 41 and the polysilicon 54. Ferroelectric layer 57 is then deposited in step 622 as discussed above; a second anneal step 623 may then be performed at about the same temperature and times as the first anneal. Then electrode layer 58 is formed by sputtering platinum in step 624. The wafer is then annealed in a third anneal step 628, preferably at a temperature of between 600° C. and 850° C. for from 30 minutes to four hours; the samples made were annealed at 800° C. for one hour in oxygen.

Gate structure 61 of FET 40 is now patterned in steps 630 and 632. Preferably, a photo resist (P.R.) is deposited in step 630, developed using a mask, then electrode 58, ferroelectric 57 and insulator 52 are defined in step 632 by ion milling followed by ashing. In step 634, the active areas, including source/drains 42 and 44, are preferably formed by a self-aligned process. In the self-aligned process, platinum layer 58 is essentially unaffected by the implant and protects the underlying layers, as well as acting as a mask for adjacent edge 94 of the source/drain. The relatively tall stack of gate structure 61 helps to sharply define adjacent edge 94 of the active areas. This self-aligned process is important for forming source/drain regions 42 and 44 because it ensures that the source/drains do not underlie gate structure 61. The self-aligned process is preferably a phosphorous diffusion process or an ion implantation process in which ions, preferably phosphorous ions, are electrically accelerated and driven into semiconductor 41. It may also comprise depositing a dopant on semiconductor substrate 41 in a well formed in the process of patterning of gate structure 61 and driving the dopant into the active areas using heat. Any other suitable self-aligned process may be used as well. Whichever process is used, patterned gate structure 61 is annealed again in fourth anneal step 635 in an oxygen furnace, preferably at a temperature of between 600° C. and 850° C. for from 15 minutes to three hours; the samples made were annealed at 800° C. for 30 minutes. This anneal also helps to drive the dopant into the active areas, including source/drains 42 and 44.

The relative thicknesses of layers 51, 52, 53 and 57, particularly 51, 52, and 53 are important. Preferably, silicon dioxide 51 is from 2 nm to 8 nm thick, the insulator combination 52 and 53 is from 15 nm to 35 nm thick, and ferroelectric material 57 is from 20 to 400 nm thick. For the specimens made, silicon dioxide 51 was 4.0 nm thick, insulator 52 was 25.0 nm thick, ferroelectric 57 was 380 nm thick, and electrode 58 was 400 nm thick.

An interlayer dielectric 92, preferably SOG (spin-on-glass), is formed in step 636, and then patterned in steps 637, 638, and 639 to form the holes for the source/drain contacts. In FIGS. 15 and 16, the interlayer dielectric has become integral with passivation layer 154, since they are made of essentially the same material. The metallization, such as 64, is then deposited in step 644. The metallization is patterned in steps 646, 648, and 650, followed by another anneal, which is preferably performed at 800° C. for 30 minutes. In some embodiments, the back side or bottom of wafer 41 is then metallized in step 660, preferably with an aluminum layer. FET 40 and memory 200 are then completed with a conventional passivation layer 154 (FIGS. 15 and 16) and packaging in step 670.

There have been described what are at present considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric FET structures can be used in combination with the addressing scheme shown, for example, MFISFET structures. Further, now that the possibility and advantages of addressing a single ferroelectric FET in the manner specified above has been disclosed, many modifications and variations of the principles disclosed may be devised. The present embodiments are, therefore, to be considered as illustrative and not restrictive. The scope of the invention is indicated by the appended claims.

We claim:

1. A method of reading a selected memory cell in a ferroelectric memory, said memory including a plurality of memory cells arranged in rows and columns, each said cell containing a ferroelectric FET having a gate electrode, a first source/drain, and a second source/drain, said method comprising:

placing all of said gate electrodes in a high resistance, open electronic state of at least one gigaohm resistance; and reading said selected memory cell by determining a first source/drain current flow state of said first source/drain of said selected memory cell, outputting a first signal representative of a first logic state of said selected memory cell if said current flow is a first current flow, and outputting a second signal representative of a second logic state of said selected memory cell if said current flow is a second current flow.

2. A method as in claim 1 wherein said first source/drain is a source.

3. A method as in claim 1 wherein said first source/drain is a drain.

4. A method as in claim 3 wherein said second source/drain is a source, and said step of reading comprises applying a first voltage to each said source in said memory cells in the same row as said selected memory cell and applying a second voltage to each said source not in said selected row.

* * * * *